United States Patent [19]
Sato et al.

[11] Patent Number: 6,106,613
[45] Date of Patent: Aug. 22, 2000

[54] SEMICONDUCTOR SUBSTRATE HAVING COMPOUND SEMICONDUCTOR LAYER, PROCESS FOR ITS PRODUCTION, AND ELECTRONIC DEVICE FABRICATED ON SEMICONDUCTOR SUBSTRATE

[75] Inventors: Nobuhiko Sato, Sagamihara; Takao Yonehara, Atsugi, both of Japan

[73] Assignee: Canon Kabushiki Kaisha, Tokyo, Japan

[21] Appl. No.: 09/041,123

[22] Filed: Mar. 12, 1998

[30] Foreign Application Priority Data

Mar. 17, 1997 [JP] Japan ..................................... 9-062856

[51] Int. Cl.$^7$ .................................................. C30B 19/00
[52] U.S. Cl. ................................ 117/54; 117/58; 117/84; 117/94; 117/104; 117/108; 117/954
[58] Field of Search .................................. 438/46, 47, 409, 438/413, 479, 481, 753, 763, 795, 960; 117/54, 58, 108, 954, 84, 94, 104

[56] References Cited

U.S. PATENT DOCUMENTS

| | | | |
|---|---|---|---|
| 5,258,322 | 11/1993 | Sakaguchi et al. | 438/507 |
| 5,356,509 | 10/1994 | Terranova et al. | 117/58 |
| 5,371,037 | 12/1994 | Yonehara | 438/459 |
| 5,439,843 | 8/1995 | Sakaguchi | 438/459 |
| 5,712,199 | 1/1998 | Nakagawa | 438/62 |
| 5,869,387 | 2/1999 | Sato et al. | 438/459 |

FOREIGN PATENT DOCUMENTS 404318922A 11/1992 Japan .

OTHER PUBLICATIONS

Vyas, S. et al., "Growth of epitaxial Ge(x)Si(1–x) for infrared detectors by UHV/CVD", Vacuum vol. 46 No. 8–10 (1065–1069), 1995.

Fernandez, J.M. et al., "Silicon/silicon–germanium multiple quantum wells grown by gas–source molecular beam epitaxy: hydrogen coverage and interfacial abruptness", Journal of Crystal Growth 164 (241–247), 1966.

Marschner, T. et al., "Epitaxial layer morphology of highly strained GaInAs/InP multiple quantum well structures grown by CBE", Microelectronics Journal vol. 28 (849–855), 1997.

Lecture Drafts for the 48th Scientific Lecture Meeting of the Society of Applied Physics, Nagoya University in Japan, Oct. 17–20, 1987, p. 230. In Japanese with English translation.

K. Maehashi et al., "Initial Stages of GaAs Molecular Beam Epitaxy Growth on Porous Si", Japan. J. Appl. Phys., vol. 30, No. 4B, pp. L683–L685 (1991).

(List continued on next page.)

*Primary Examiner*—Benjamin L. Utech
*Assistant Examiner*—Donald L. Champagne
*Attorney, Agent, or Firm*—Fitzpatrick, Cella, Harper & Scinto

[57] ABSTRACT

In a semiconductor substrate comprising a silicon substrate having a porous region, and a semiconductor layer provided on the porous region, the semiconductor layer comprises a single-crystal compound and is formed on the surface of the porous region with its pores having been sealed at the surface. This substrate can be produced by a process comprising the steps of heat-treating the silicon substrate 11 having a porous region, to seal pores at the surface of the porous region 13, and forming a single-crystal compound-semiconductor layer 14 by heteroepitaxial growth on the porous region having the pores sealed by the heat treatment.

Single-crystal compound semiconductor films with less crystal defects can be formed on large-area silicon substrates in a high productivity, a high uniformity, a high controllability and a great economical advantage.

12 Claims, 7 Drawing Sheets

OTHER PUBLICATIONS

V. Labunov et al., "Heat Treatment Effect on Porous Silicon", Thin Solid Films, vol. 137, No. 1, pp. 123–134 (1986).

T.W. Kang et al., "Growth of GaAs epitaxial layers on porous silicon", Microelectronics J., vol. 27, No. 4/05, pp. 423–436 (1996).

T. Unagami et al., "Structure of Porous Silicon Layer and Heat–Treatment Effect", J. Electrochem. Soc., vol. 125, No. 8, pp. 1339–1344 (1978).

Patent Abstracts of Japan, vol. 097, No. 003, Mar. 31, 1997 (corresponds to JP 08–316192).

J.C. Campbell et al., "Photoluminescence of porous silicon buried underneath epitaxial GaP", Appl. Phys. Lett., vol. 60, No. 7, pp. 889–891 (1992).

N. Sato, "Epitaxial Growth on Porous Si for a New Bond and Etchback Silicon–on–Insulator", J. Electrochem. Soc., vol. 142, No. 9, Sep. 1995, pp. 3116–3122.

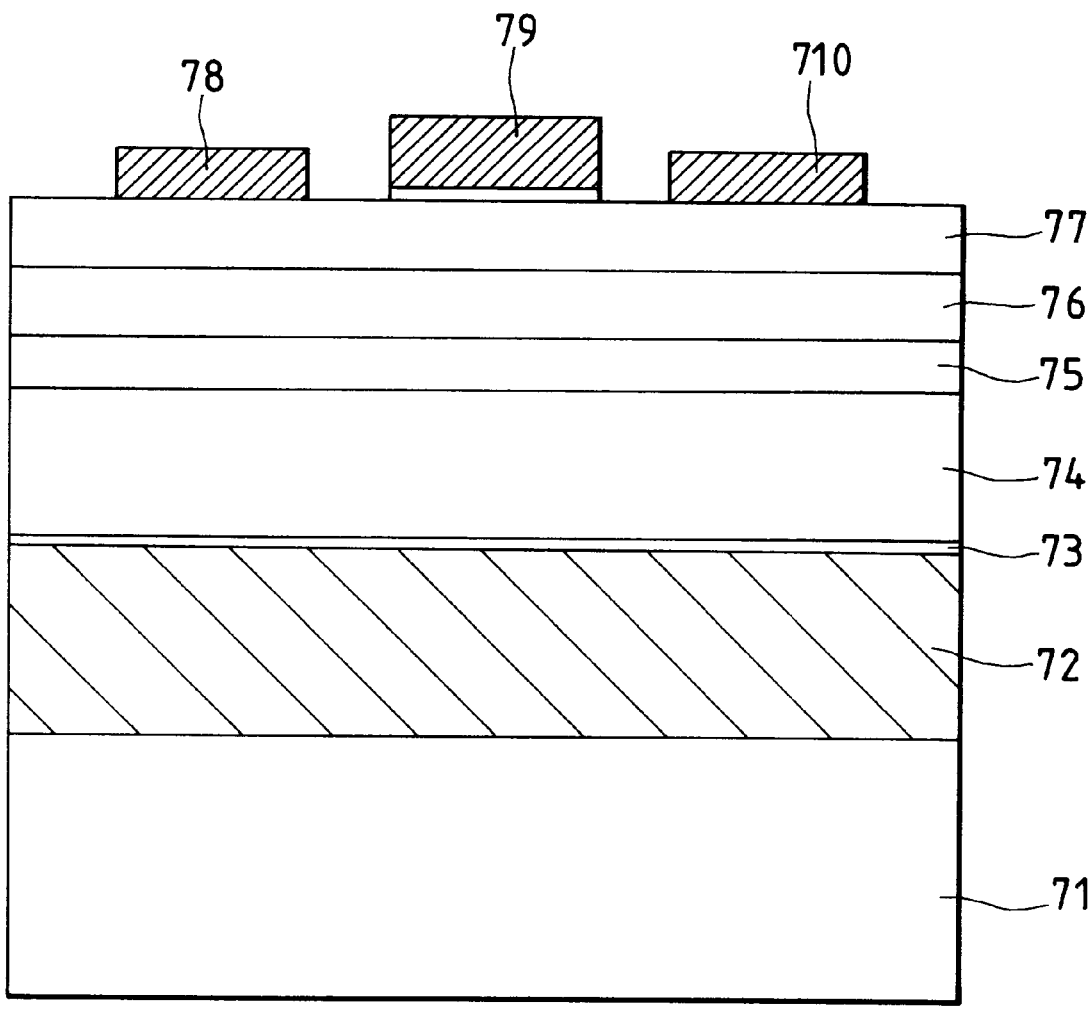

SEMICONDUCTOR SUBSTRATE HAVING COMPOUND SEMICONDUCTOR LAYER, PROCESS FOR ITS PRODUCTION, AND ELECTRONIC DEVICE FABRICATED ON SEMICONDUCTOR SUBSTRATE

BACKGROUND OF THE INVENTION

1. Field of the Invention

This invention relates to a semiconductor substrate and a process for its production. More particularly, it relates to a semiconductor substrate comprising a silicon substrate and a single-crystal compound semiconductor form d thereon, suited for the fabrication of electronic d ices and formation of integrated circuits, and to process for its production. It also relates to an electronic device fabricated on this semiconductor substrate.

2. Related Background Art

Group IV elements belonging to Group IV of the periodic table, such as Si ad Ge, have been used from the beginning as materials for substrates (wafers) for semiconductor devices and have highly advanced. At present too, as well known, variety of electronic devices such as DRAMs, MPUs, logic ICs and analog ICs are fabricated on silicon (Si) substrates, and these elements are utilized as mat rials for active regions of diodes, MOS transistors a d bipolar transistors. These Group IV elements, however, are not suited for constituents of light-emitting diodes.

Meanwhile, Group III–V or II–VI compound semiconductors as typified by GaAs, GaP, InP, GaN and ZnSe are very suited for light-emitting devices such as LEDs and lasers. Research has been conducted thereon in great variety, and LEDs and semiconductor lasers have already been put into practical use. Also, HEMTs (High Electron Mobility Transistors) are prepared using these compound semiconductors, and high-frequency circuits that can be used at GHz band regions have been put into practical use.

Compound semiconductor substrates, however, have so low a mechanical strength that it is difficult to produce large-area wafers of compound semiconductors. Accordingly, such wafers have a fairly smaller size than silicon wafers, and hence are obtained at a lower production efficiency than silicon wafer processes. Moreover, the production cost of the wafer themselves is a little more than 10 times that of silicon wafers having the same size.

To overcome such problems, it has been attempted to promote heteroepitaxial growth of compound semiconductors on the silicon substrates that have a high mechanical strength and enable production of large-area wafers, as typified by GaAs on Si. This technique is a method by which light-emitting devices or high-speed electronic devices such as LEDs and lasers making use of compound semiconductors are formed on silicon substrates having a high mechanical strength and also being inexpensive and still also having a high thermal conductivity, thereby aiming at improvement of productivity, achievement of cost reduction and so forth and spread of these devices. In addition, since such light-emitting devices and high-speed electronic devices can be integrated on the same substrates as those of highly advanced Si-LSIs, it becomes possible to realize Opto-Eletronic Integrated Circuits (OEICs).

However, some problems are pointed out in respect of the growth of compound semiconductors on such Si, and there are many difficulties in the fabrication of devices by the use of the compound semiconductors grown on Si.

One of them is the occurrence of antiphase domains caused by polarity/non-polarity, which causes a great stress or lattice imperfections in epitaxial layers. The other is the presence of a difference in coefficient of thermal expansion and a lattice mismatch, which causes a stress or lattice imperfections between silicon substrates and compound semiconductor films.

The former can be restrained by using silicon substrates having off-angles. The latter can not be settled with ease, and many research institutes have made studies on various crystal growth techniques, but, at present, can not still break the barrier of $10^6/cm^2$ with ease in respect of the dislocation density that can be an indication of crystal quality. This is said to be due to a lattice strain caused by disagreement in lattice constant between silicon substrates and compound semiconductor layers. Lattice defects brought in at a high density may deteriorate device characteristics such as light-emitting characteristics and durability, and are not practical. Accordingly, it is sought to form on silicon substrates, III–V or II–VI compound semiconductor thin films having a low defect density comparable to compound wafers.

Many studies on single-crystal semiconductor films of IV—IV compounds such as SiC and SiGe are also reported as light-emitting materials, and these single-crystal compound-semiconductor films are also desired to be formed on silicon substrates. Thus, for similar reasons, it has been strongly demanded to decrease such crystal defects also when the single-crystal films of SiGe or SiC IV—IV compound type ones are formed on silicon substrates.

As discussed above in detail, the demand for heteroepitaxy by which single crystals having a good crystal quality are grown on silicon substrates is at a high level, but there is still only a low possibility of accomplishing it.

Many reports are made on heteroepitaxial growth on such silicon substrates.

Some reports have presented an attempt to form a porous silicon layer on the surface of a silicon substrate and make heteroepitaxial growth on that layer so as to decrease the crystal defects.

Ohmachi et al. have reported in The Society of Applied Physics 1987 20aX5, "GaAs Growth on Porous Si", NTT ECL Y. Ohmachi, W. Watanabe, Y. Kadota and H. Okamoto, that there are differences in surface properties and half width between an offset substrate and a just substrate when crystals are grown by MOCVD (Metal Organic Chemical-Vapor Deposition) and MBE (Molecular-Beam Epitaxy) on 10 $\mu$m thick porous silicon substrates.

It is also known that, when GaAs crystals are grown by MBE on 10 $\mu$m thick porous silicon substrates, their cross-sectional TEM observation reveals the presence of more defects than GaAs crystals grown on silicon substrates under the same conditions.

Thus, some attempts to improve crystal quality by the use of porous silicon are reported. Although the crystal strain of compound semiconductor layers formed by heteroepitaxial growth can be relieved in some instances, the compound semiconductors have so poor a crystal quality that it has been very difficult to apply them to devices.

In heteroepitaxial growth on silicon substrates having a main plane of (100)-plane in plane direction, the films grown commonly have rough surfaces. To solve this problem, it has been necessary to use what is called an offset substrate, in which the plane direction is angled by some degrees from the (110)-plane. The PA of FIG. 3 shows an off-angle dependence of surface roughness (average square roughness). In order to attain good surface morphology, the off-angle must be precisely controlled. Such precise control has tended to bring about an increase in yield and in substrate cost as well.

Meanwhile, in homoepitaxy on porous silicon substrates, the present inventors have discovered that, in silicon homoepitaxial growth by heat CVD using a source gas diluted with hydrogen, the crystal quality can be improved when surface pores are stopped up by hydrogen prebaking carried out immediately before the source gas is supplied (N. Sato, K. Sakaguchi, K. Yamagata, Y. Fujiyama and T. Yonehara, J. Electrochem. Soc. 142 (1995), p.3116).

FIGS. 2A and 2B are diagrammatic illustrations to describe a process in conventional techniques. In FIGS. 2A and 2B, reference numeral 20 denotes a porous layer (porous silicon substrate); 21, walls of the porous layer; 22, pores of the porous layer; 24, a single-crystal compound-semiconductor film; and 25, crystal defects.

First, a porous silicon substrate 20 is prepared (FIG. 2A). Next, the porous silicon substrate 20 is placed in a reaction chamber of a CVD apparatus, and a single-crystal film 24 of a compound semiconductor such as GaAs is formed by heteroepitaxial growth on the porous silicon substrate, using trimethyl gallium (TMGa) or arsine ($AsH_3$) as a source gas (FIG. 2B).

In the single-crystal compound semiconductor film 24 thus formed, crystal defects 25 due to strain, lattice mismatch and grain boundaries are produced on the side of the surface 26 of the porous silicon substrate 20.

SUMMARY OF THE INVENTION

An object of the present invention is to provide a semiconductor substrate as a large-area silicon substrate on which a single-crystal compound-semiconductor film having less crystal defects can be formed in a high productivity, a high uniformity, under a high controllability and at a low cost.

Another object of the present invention is to provide a process by which a single-crystal compound-semiconductor film having smooth surface and less crystal defects can be formed on a large-area silicon substrate where the offset (off-angle of plane direction) is not particularly specified.

To achieve the above objects, the present invention provides a semiconductor substrate comprising a silicon substrate having a porous region, and a semiconductor layer provided on the porous region, wherein;

the semiconductor layer comprises a single-crystal compound semiconductor and is formed on the surface of the porous region with its pores having been sealed at the surface.

The present invention also provides a process for producing a semiconductor substrate, comprising the steps of;

heat-treating a silicon substrate having a porous region, to seal pores at the surface of the porous region; and forming a single-crystal compound-semiconductor layer by heteroepitaxial growth on the porous region having the pores sealed by the heat treatment.

According to the present invention, a compound semiconductor layer having a good crystal quality and a smooth surface can be formed over a large area on a silicon substrate the off-angle of plane direction of which is not particularly specified.

In particular, the compound semiconductor layer having both a good crystal quality and a smooth surface can be formed by heteroepitaxial growth over a large area at one time even on substrates having a low off-angle, e.g., silicon substrates having an off-angle within 1° with respect to the (100)-plane, which are commercially available in variety.

According to the present invention, a semiconductor device, a semiconductor substrate and a process for its production can be provided which can answer the problems the prior art has had. More specifically, compound semiconductor substrates with a high quality can be produced using inexpensive silicon substrates, and, using such substrates, compound semiconductor devices with good characteristics can be fabricated at a low cost.

BRIEF DESCRIPTION OF THE DRAWINGS

FIG. 7 is a cross-sectional view of an HEMT as a transistor according to the present invention.

DESCRIPTION OF THE PREFERRED EMBODIMENTS

In an embodiment of the present invention, before a single-crystal compound semiconductor layer is formed by heteroepitaxial growth on a porous silicon substrate, the substrate is heat-treated in an atmosphere of hydrogen, whereby a single-crystal compound semiconductor layer improved in crystal quality can be formed on the silicon substrate, the compound semiconductor layer with a good crystal quality can be formed on the silicon substrate surpassingly in view of productivity, uniformity, controllability and economical advantages, and also a semiconductor substrate production process can be proposed which can be applied to conventional compound semiconductor devices while ensuring their advantages.

In another embodiment of the present invention, pores at the surface of porous silicon formed by processing a silicon substrate originally having a good crystal quality are sealed by heat treatment while supplying a trace amount of silicon, to form thereon a single-crystal compound-semiconductor layer with a good quality. Thus, a large number of substrates can be processed at one time, and their crystal quality can be improved to a level comparable to or higher than that of single-crystal compound-semiconductor substrates themselves without lowering their productivity and economical advantages.

In the present invention, pores at the surface of porous silicon formed by processing a silicon substrate originally having a good crystal quality are sealed by heat treatment while supplying a trace amount of silicon, to form the single-crystal compound-semiconductor layer over a large area at one time without bringing in the single-crystal compound-semiconductor layer any crystal defects due to strain and lattice mismatch. Thus, photoelectric transducers such as solar cells, light-emitting devices such as lasers and light-emitting diodes and transistors such as HEMTs can be formed on such single-crystal compound-semiconductor layers while ensuring the characteristics comparable to instances where they are formed on single-crystal compound-semiconductor substrates themselves, and also can be formed surpassingly in view of productivity, uniformity, controllability and economical advantages.

The present invention will be described below in detail with reference to the accompanying drawings.

Figure 1A:
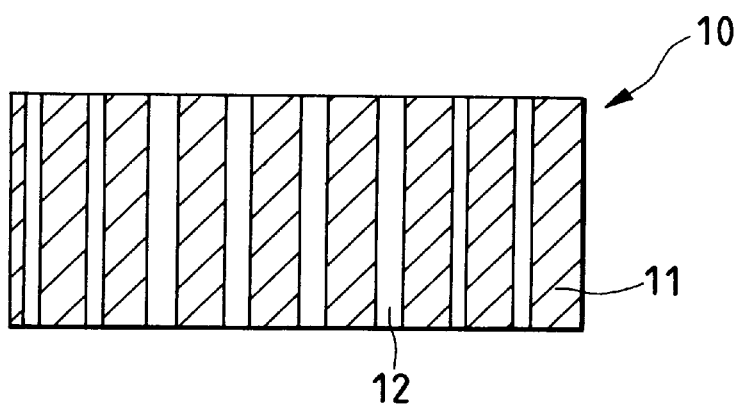
FIGS. 1A, 1B and 1C are diagrammatic cross-sectional views to describe a process of the present invention.
Figure 1B:
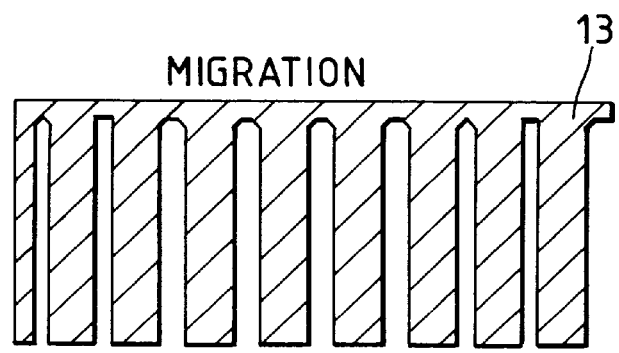
Figure 1C:
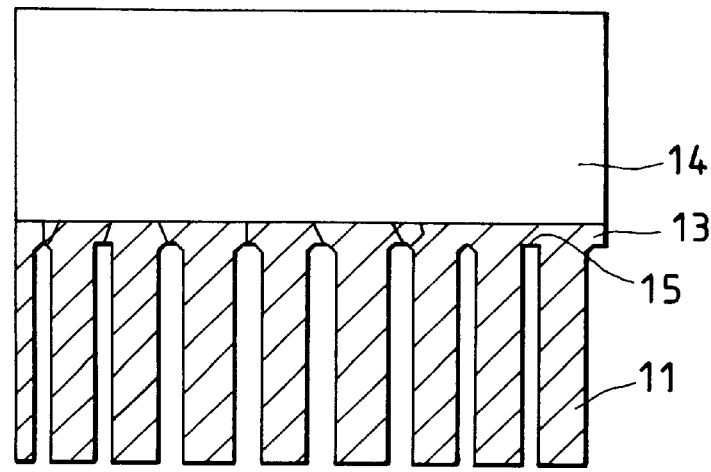

FIGS. 1A to 1C are diagrammatic cross-sectional views showing a process for producing a semiconductor substrate as a preferred embodiment of the present invention.

In FIGS. 1A to 1C, reference numeral 10 denotes a silicon substrate having a porous region, which has pores 12 of the porous region and walls 11 that form the pores. In the drawing, the pores 12 are illustrated in a simple form for the purpose of easy understanding. Actually, in many cases, the pores 12 have a complicated form like branched open pores.

Figure 2A:
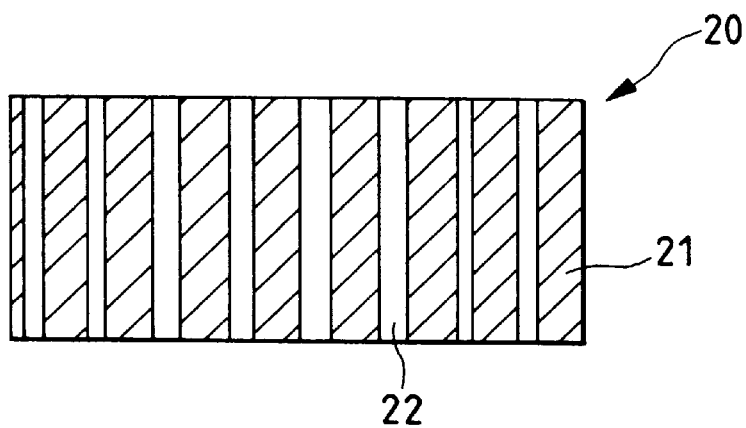
FIGS. 2A and 2B are diagrammatic cross-sectional views to describe a process of the prior art.
Figure 2B:
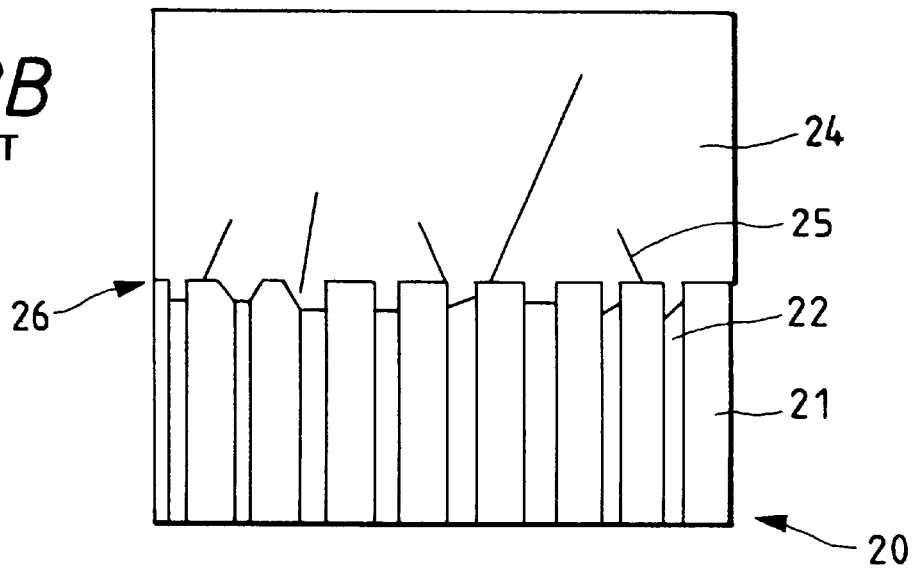

As shown in FIG. 1A, first, the silicon substrate 10 having a porous region is prepared (FIG. 2A). Such a silicon substrate 10 may be obtained by anodizing a commonly available silicon wafer (non-porous silicon substrate), whereby the whole wafer or only the surface portion of the wafer can be made porous.

Next, the silicon substrate 10 having a porous region is heat-treated in an atmosphere of hydrogen. As a result of this heat treatment in an atmosphere of hydrogen, native oxide films unwantedly formed on the surface of the substrate are removed. The native oxide films are removed by the following reaction in a high-temperature atmosphere of hydrogen.

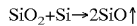

$SiO_2 + Si \rightarrow 2SiO\uparrow$

The heat treatment in an atmosphere of hydrogen is further continued, whereupon the migration of surface atoms takes place at the surface of the porous silicon so as to smoothen fine roughness to decrease surface energy. As the result, the pores at the surface are stopped up and a surface portion 13 is formed in which the pore density has remarkably decreased.

This surface portion 13 can also be regarded as a very thin, non-porous silicon layer as shown in FIG. 1B. This silicon layer is sufficiently thinner than the compound semiconductor layer formed later.

Next, as shown in FIG. 1C, a single-crystal compound semiconductor film 14 is formed by heteroepitaxial growth on the silicon substrate having the porous region whose pores at the surface have been stopped up or sealed.

As described above, as a result of the formation of the single-crystal compound-semiconductor film 14, any crystal defects 15 that may be brought in because of the lattice mismatch with silicon, the drop of temperature from film-forming temperature to room temperature and the difference in coefficient of thermal expansion are brought in only the very thin silicon layer 13 that seals the pores of porous silicon and are not brought in the single-crystal compound-semiconductor film 14. This is because the very thin silicon layer 13 formed on the porous region which is more fragile than the bulk silicon is far more fragile than the single-crystal compound-semiconductor film 14. Hence, the crystal defects 15 are preferentially brought in this silicon layer 13.

In this way, the crystal defects 15 are preferentially brought in the silicon layer 13, so that the single-crystal compound-semiconductor film 14 having less crystal defects can be obtained also by heteroepitaxial growth.

In the above treatment to seal the pores 12, the substrate is heat-treated in an atmosphere of hydrogen where no gases containing silicon atoms are present. Alternatively, it may be heat-treated in an atmosphere of hydrogen to which a trace amount of gas containing silicon atoms has been added. Stated specifically, it may be heat-treated in an atmosphere of, e.g., hydrogen only, a mixed gas of hydrogen and inert gas, a mixed gas of hydrogen and silicon compound, or a mixed gas of hydrogen, inert gas and silicon compound.

If residual oxygen or water content is unwantedly present in the atmosphere for the heat treatment, these may react with silicon to form silicon oxide, and also the reaction according to the above scheme may further proceed, so that the silicon may be etched depending on the size of pores and the heat treatment temperature and hence the pores at the porous surface may not be sealed.

Accordingly, in the present invention, the substrate may be heat-treated while compensating the silicon that is lost as a result of etching, or while supplying silicon a little in excess of it. In this heat treatment, not only silicon atoms on the porous surface but also silicon atoms adsorbed on the porous silicon surface migrate so as to decrease the surface energy, so that the pores at the surface are stopped up and the surface portion in which the pore density has remarkably decreased is formed.

Steps that can be employed in the process for producing the semiconductor substrate of the present invention will be detailed below.

Porous Silicon

On porous silicon, since its discovery in 1964 by Uhlir et al, researches keeping its application to FIPOS process in mind have been made in 1970's. Also, since discovery of photoluminescence of porous silicon by L. T. Canham et. al.'s group and U. Gosele et. al.'s group, researches aiming at its application to light-emitting devices have been made in 1990's. In the researches on light-emitting device systems, $n^-$-type and $p^-$-type silicon substrates are preferred. On the other hand, in the case where non-porous single crystals are formed on porous silicon by heteroepitaxial growth, $n^+$-type and $p^+$-type silicon substrates are preferred to the $n^-$-type and $p^-$-type silicon substrates in view of structural stability of the crystals and good crystal quality of the epitaxial silicon layer. The porous silicon intended in the present invention is substantially the same as these porous silicon having been studied until know, and can be produced by anodization or the like process, which, however, has no limitations on the impurities, plane direction, production process, etc., of the substrate so long as it is porous silicon.

The pore density on the porous surface may differ depending on its production process and the impurity density of the substrate. For example, it is about $10^{10}$ to $10^{12}/cm^2$.

When the porous silicon is formed by anodization, an aqueous solution composed chiefly of HF (hydrofluoric acid) is used as an anodizing solution. An alcohol such as ethanol is commonly added to make the contact angle on the silicon surface greater so that any bubbles adsorbed thereon can be eliminated at a higher rate to make the anodization uniformly take place. Of course, the porous structure can be formed also without use of the alcohol. The porous silicon in the present invention may preferably have a porosity lower than that used in the FIPOS process (a porosity of about 50% or less, and more preferably 30% or less), but not limited to it.

The porous silicon is formed by the action of electrolytic etching in the anodization, and hence its surface has a fine roughness also at the part other than the pores when observed with a Field Emission Type Scanning Electron Microscope (FESEM).

Preoxidation

The walls between adjoining pores in the porous silicon have a very small thickness of from several nm to tens of nm, and hence rearrangement of pores in the interior of the porous layer may take place at the time of epitaxial growth and at the time of thermal oxidation of the surface of the epitaxially grown layer, as well as at the time of heat treatment in the subsequent step, so that characteristics of speed-up etching of the porous silicon may be damaged. Accordingly, after the porous silicon has been formed, thin protective films may previously be formed on the wall surfaces of pore walls by thermal oxidation or the like process. This restrains the pores from becoming rough. In the formation of the protective films, it is essential to leave the regions of single-crystal silicon inside the pore walls. Thus, the protective films may be in a layer thickness of about several nm at most.

This step (preoxidation) may be omitted if the heat treatment temperature is made sufficiently lower and any structural change of the porous silicon is restrained.

HF Immersion

Because of the above preoxidation or any native oxidation occurring after the formation of the porous silicon, protective films such as silicon oxide films are formed on the surface of the porous silicon and the inner wall surfaces of the pores in the porous silicon. Hence, this porous silicon is immersed in an aqueous HF solution to remove the protective films from only the vicinity of the surface of the porous region. According to the present process, the oxide films on the pore walls at the inner part of the porous silicon are not removed, and hence the pores in the porous interior can be well restrained from becoming rough even when the subsequent heat treatment is made at a high temperature.

Heat Treatment

In the present invention, in order to seal the pores at the surface of the porous silicon region, the porous silicon region is heat-treated.

The heat treatment to seal the pores at the surface of the porous silicon region may be carried out in an atmosphere where no gases containing silicon atoms are present or in an atmosphere of hydrogen which contains gases containing silicon atoms.

The heat treatment in an atmosphere of hydrogen where no gases containing silicon atoms are present may be made at a temperature of from 600° C. to 1,400° C., and preferably from 900° C. to 1,200° C. There are no particular limitations on the pressure, and preferably the heat treatment may be carried out at the atmospheric pressure or below. Hydrogen gas used may be a gas having a dew point of −92° C. or below. Hydrogen gas with a high dew point has residual oxygen and water content in a large quantity. Such gas, however, oxidizes silicon and the silicon oxide thus formed is removed by reaction.

Consequently, it follows that silicon is etched in excess. Once it occurs, the quantity of silicon atoms necessary for sealing the pores become short, resulting in a decrease of pore density. Attention must be well paid to any leak from chambers so that the dew point may not rise.

The heat treatment atmosphere used in the present invention may be not only an atmosphere of hydrogen only, but also an atmosphere of a mixed gas of hydrogen and inert gas such as argon or helium. Since the atmosphere is affected by the residual water, oxygen and so forth in the gas, a mixed gas having a dew point of −92° C. or below is used also in this instance. When the mixed gas is used, hydrogen is in a lower concentration, and hence safety can be made higher in case it leaks by any chance.

Figure 3:
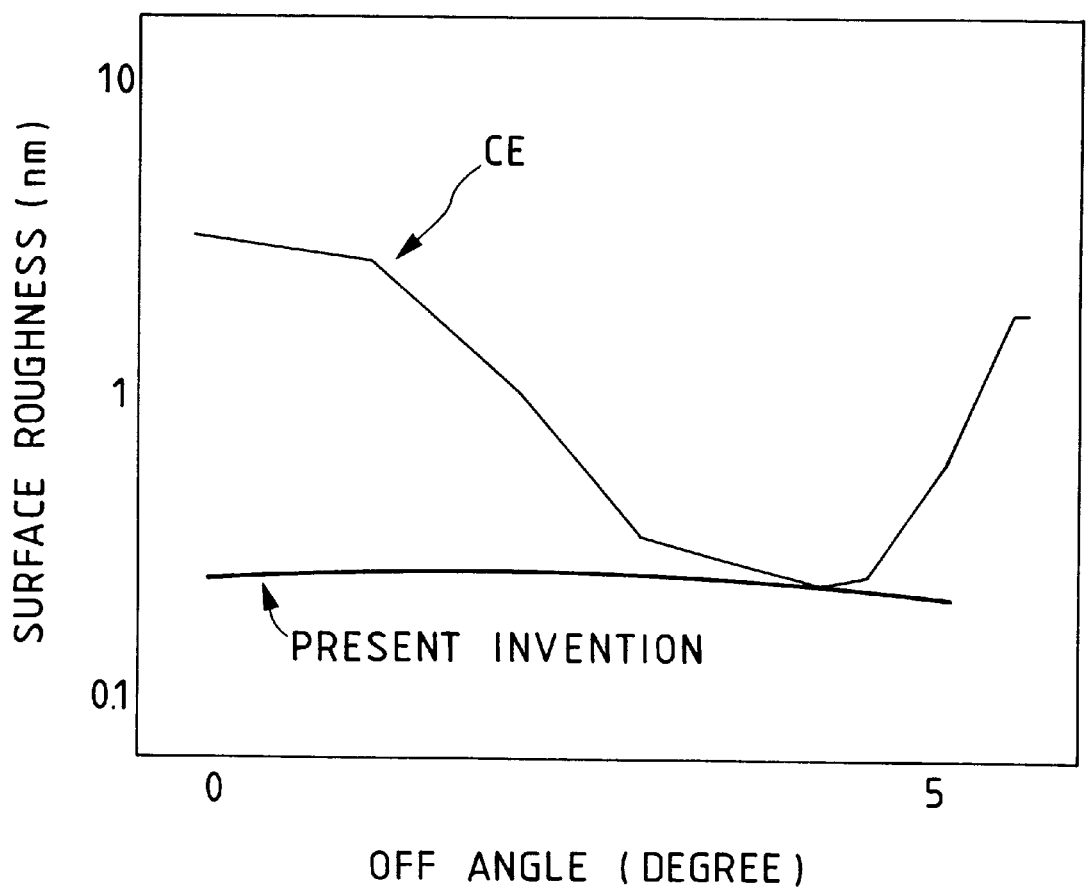
FIG. 3 is a graph showing the relationship between off-angles and surface roughness of substrates.

The migration of surface silicon atoms takes place in this way, whereby the pores at the surface of the porous region are sealed. The silicon layer thickness required to seal the pores is so much small as to be substantially equal to, or not larger than, the diameter of each pore, and stated specifically 100 nm or smaller, and preferably 30 nm or smaller. The surface where the pores have been sealed stands a surface having gentle irregularities (undulations) with an amplitude of about 1 to 10 nm at periods of from 0.5 to 50 $\mu$m, preferably from 1 to 9 $\mu$m, and typically several $\mu$m. Observation of this surface by the use of an atomic force microscope reveals that atomic steps are formed along the irregularities. These irregularities (undulations) have a pressure dependence, and the undulations can be made larger in amplitude when the heat treatment atmosphere is controlled preferably at a pressure not higher than the atmospheric pressure, and more preferably a pressure of from 200 Torr to 0.001 Torr. As the result, the surface of the compound semiconductor film formed thereon can have the morphology as shown in FIG. 3, where the surface is smoother than that of an instance CE on the bulk silicon free of off-angles and does not depend on off-angles. This is presumably because the formation of gentle irregularities (undulations) makes the step density higher like the off substrate even if the off-angles are small.

In order to prevent unwated nitridation or oxidation of silicon surface, it is also desired that the heat treatment atmosphere has been replaced by hydrogen at the time of temperature rise and drop before and after the step of heat treatment in a steady state, when it stands at least at a temperature of 800° C. or above, and preferably 600° C. or above.

In the heat-treating step used in the present invention, a trace amount of a gas containing silicon atoms may be supplied so that the porous silicon is heat-treated in an atmosphere to which a trace amount of the gas containing silicon atoms has been added. This step of heat treatment will be described below.

As to the atmosphere at the time of heat treatment, the heat treatment may preferably be made in a non-oxidative atmosphere, and more preferably in an atmosphere comprised of hydrogen, or hydrogen and an inert gas. Alternatively, it may be done in vacuo. As a result of the heat treatment in any of these atmospheres, the pores at the surface of porous silicon are sealed. If, however, residual oxygen or water content is present in the atmosphere for the heat treatment, these may react with silicon to form silicon oxide, and also this reaction may further proceed, so that the silicon may be etched and hence the pores at the porous surface may not be sealed.

Accordingly, in the present invention, the pore at the porous surface is sealed by heat-treating the substrate while compensating the silicon that is lost as a result of etching, or while supplying silicon a little in excess of it. In this heat treatment, on the surface of the porous silicon, the silicon atoms on the porous surface migrate so as to smoothen the fine roughness and decrease the surface energy and, among silicon atoms supplied from the gaseous phase, the silicon atoms adsorbed on the porous silicon surface also migrate so as to decrease the surface energy, so that the pores at the surface are stopped up and the surface portion in which the pore density has remarkably decreased is formed. The migration of silicon atoms on the surface is attributable to the supplied heat energy.

In the present invention, in order to cause especially the surface silicon atoms to migrate in a good efficiency, the heat treatment may preferably be carried out at a relatively high temperature of the melting point of silicon or lower. Stated specifically, it may preferably be done at a temperature of from 600° C. to 1,400° C., more preferably from 800° C. to 1,200° C., and still more preferably from 1,000° C. to 1,200° C. There are also no particular limitations on the pressure, and preferably the heat treatment may be carried out at the atmospheric pressure or below. A smooth surface tends to be formed especially in an atmosphere containing hydrogen.

After this heat treatment, as is seen from observation of cross-sectional structure, the porous structure remains, only the pores at the surface are sealed, and a thin silicon film with a very small thickness of from 1 nm to 100 nm is formed on the surface.

The surface where the pores have been sealed in this way stands a surface having undulations (gentle irregularities) with an amplitude of about 1 to 10 nm at periods of from 0.5 to 50 $\mu$m, preferably from 1 to 9 $\mu$m, and typically several $\mu$m. Observation of this surface by the use of an atomic force microscope reveals that atomic steps are formed along the irregularities. These undulations (irregularities) have a pressure dependence, and the undulations can be made larger in amplitude when the heat treatment atmosphere is controlled preferably at a pressure not higher than the atmospheric pressure, and more preferably a pressure of 200 Torr or below.

As the result, the surface of the compound semiconductor film formed thereon can have the morphology as shown in FIG. 3, where the surface is smoother and does less depend on off-angles than that of an instance CE on the bulk silicon free of off-angles. This is presumably because the formation of undulations makes the step density higher like the off substrate even if the off-angles are small.

In the instance where the silicon is supplied from the gaseous phase in excess of the silicon that is lost from the porous region as a result of etching, a very thin film of silicon is formed concurrently with the sealing of pores. If such a very thin film comes to have a large layer thickness, the crystal defects may be brought in the compound semiconductor layer, too, when the single-crystal compound-semiconductor layer is formed. This disagrees with the object of the present invention. Such a very thin film may preferably be in a layer thickness smaller than that of the compound semiconductor layer, e.g., not more than $\frac{1}{5}$, and more preferably not more than $\frac{1}{10}$, of the latter. Stated specifically, its thickness may be selected from the range of 1 nm to 100 nm while taking account of the layer thickness of the compound semiconductor layer.

When a silicon gas such as $SiH_2Cl_2$, $SiH_4$, $SiCl_3$ or $SiCl_4$ is used as a supply source of silicon atoms, the flow rate of the source gas may be so set that the very thin silicon layer is formed at a growth rate of 20 nm/min or below, preferably 10 nm/min or below, and more preferably 2 nm/min or below. In a film-forming process in which the silicon is supplied from a solid source and the substrate temperature is as low as 800° C. or below, as in the case of the MBE process, it may preferably be formed at a growth rate of 0.1 nm/min or below.

Heteroepitaxial Growth of Compound Semiconductor Single Crystal

The single-crystal compound semiconductor is formed by MOCVD or MBE on the silicon substrate having the porous silicon layer whose pores at the surface have been sealed. In usual heteroepitaxial growth on single-crystal silicon wafers, the wafers are heat-treated to about 1,200° C. in ultra-high vacuum in order to remove native oxide films from the silicon surfaces before growth. In the present invention, because of use of the porous silicon, which tends to thermally change in properties, the substrate may preferably be heat-treated at a temperature sufficiently lower than 1,200° C.

The native oxide films can be removed at such a lower temperature by previously immersing the substrate in HF or the like to remove the native oxide films therefrom and immediately setting the substrate in a heat treatment container, and by heat-treating the substrate using $H_2$ gas having a low dew-point temperature.

Alternatively, the substrate may be previously dipped in HF and thereafter placed in an atmosphere of hydrogen with a high purity, whereby the native oxide films are removed by themselves even at a low temperature of about 800° C. and thereafter the heteroepitaxial growth proceeds.

Still alternatively, without exposing the silicon substrate to the air after the above heat treatment, the silicon substrate may be placed in a chamber used for growing a single crystal of the compound semiconductor, whereby the native oxide films can be remarkably restrained from being formed and hence the above heat treatment for removing native oxide films is not required. Preferably, the heat treatment in an atmosphere of hydrogen and the growth of the compound semiconductor single crystal may be carried out in the same chamber; this is a good method. More preferably, in the course of the heat treatment in an atmosphere of hydrogen and the growth of the compound semiconductor single crystal, it is necessary for the substrate temperature not to become lower than the temperature that is lower between the both processes.

When the single-crystal compound-semiconductor film is formed in the manner as described above, the crystal defects that may be brought in because of the lattice mismatch with silicon, the drop of temperature from film-forming temperature to room temperature and the difference in coefficient of thermal expansion are brought in only the very thin silicon layer that seals the pores of porous silicon and are not brought in the single-crystal compound-semiconductor film. This is because the very thin silicon layer formed on the porous region which is more fragile than the bulk silicon is far more fragile than the single-crystal compound-semiconductor film, and hence the crystal defects can be readily brought in that layer.

To bring out the above characteristics, the single-crystal compound-semiconductor film formed by heteroepitaxial growth may preferably have a large thickness, and may preferably be at least 50 nm thick, and more preferably at least 200 nm thick.

The compound semiconductor herein referred to may be typically selected from, but not limited to, III–V compounds such as GaAs, GaP, InP and GaInAs, II–VI compounds such as ZnTe, ZnSe, ZnS, CdTe, HgTe and CdHgTe, and IV—IV compounds such as SiGe and SiC.

Fabrication of Devices

The single-crystal compound-semiconductor film formed in the manner as described above may be used in the fabrication of light-emitting devices such as light-emitting diodes and semiconductor lasers and high-speed electronic devices such as HEMTs, where the film can contribute to the achievement of characteristics comparable to or better than those in the case where the single-crystal compound semiconductor itself is used, in the case of homoepitaxial growth made on the single-crystal compound-semiconductor substrate or in the case of heteroepitaxial growth having a very small lattice strain.

The present invention will be further described below by giving Examples.

EXAMPLE 1

Four p-type (replaceable with n-type) 6-inch diameter (100) single-crystal silicon substrates each having a thickness of 615 $\mu$m and a specific resistance of 0.01 $\Omega$·cm were anodized in a solution of HF diluted with alcohol to form porous silicon layers on its one-side specular main surfaces.

The substrates were anodized under the following conditions.

Current density: 7 mA/cm$^2$
Anodizing solution: HF:H$_2$O:C$_2$H$_5$OH=1:1:1
Time: 12 minutes
Thickness of porous silicon layer: 10 $\mu$m
Porosity: 20%

Next, the resultant substrates were oxidized in an atmosphere of oxygen at 400° C. for 1 hour. As a result of this oxidation, the inner wall surfaces of porous silicon were covered with very thin thermal oxide films.

Next, two of the substrates were heat-treated at 1,050° C. at 760 Torr for 10 minutes in an atmosphere of hydrogen (H$_2$) with a dew point of –95° C., to seal the surface pores. The remaining two substrates were heat-treated at 1,050° C. at 760 Torr for 10 minutes in an atmosphere of hydrogen (H$_2$) with a dew point of –90° C. or below, to seal the surface pores. The atmosphere of hydrogen was used also when the temperature was raised and dropped.

In this state, each one of the above two sets of substrates was taken out and its surface roughness was measured with an atomic force microscope, where undulations with an amplitude of 3 nm at periods of about 2 $\mu$m were observed. The remaining substrates not put to this observation were brought to the subsequent step.

Next, on this porous silicon, single-crystal GaAs was epitaxially grown by MOCVD (Metal Organic Chemical Vapor Deposition) in a thickness of 1 $\mu$m. It was grown under the following conditions.

Source gas: TMGa/AsH$_3$/H$_2$
Gas pressure: 80 Torr
Temperature: 700° C.

As a result of cross-sectional observation with a transmission electron microscope, it was confirmed that no crystal defects were brought in the GaAs layer and a GaAs layer with a good crystal quality was formed. At the same time, it was also confirmed that a very clear and smooth interface was formed between the porous silicon layer sealed with silicon at its surface and the GaAs layer. A region of 50 $\mu$m square of the GaAs layer was also measured with the atomic force microscope to find the surface roughness. The roughness of the surface of the substrate heat-treated in an atmosphere of hydrogen with a dew point of –95° C. and on which the compound semiconductor layer was formed was 0.3 nm as average square roughness (Rrms), which was much smoother than the surface roughness of 3.5 nm found in an instance where the porous silicon was not formed and the GaAs layer was directly formed on the silicon substrate (an instance of off-angle of 0 degree), and was better than the surface roughness of 0.42 nm found in an instance of off-angle of 4 degrees.

Crystal defects actualized by defect-actualizing ethcing were also counted on an optical microscope to find defect density, which was found to be about 1×10$^4$/cm$^2$.

Meanwhile, in the instance where the substrate was heat-treated in an atmosphere of hydrogen with a dew point of –90° C. or below, the surface roughness was 0.9 nm and the defect density was about 1×10$^5$/cm$^2$.

EXAMPLE 2

A p-type (replaceable with n-type) 5-inch diameter (100) single-crystal silicon substrate of 0 degree in off-angle, having a thickness of 625 $\mu$m and a specific resistance of 0.01 $\Omega$·cm was anodized in a solution of HF diluted with alcohol to form a porous silicon layer on its one-side specular main surface.

The substrate was anodized under the following conditions.

Current density: 7 mA/cm$^2$
Anodizing solution: HF:H$_2$O:C$_2$H$_5$OH=1:1:1
Time: 12 minutes
Thickness of porous silicon layer: 10 $\mu$m
Porosity: 20%

Next, the resultant substrate was oxidized in an atmosphere of oxygen at 300° C. for 1 hour. As a result of this oxidation, the inner wall surfaces of porous silicon were covered with very thin thermal oxide films.

Next, this substrate was immersed in a 1.25% HF solution for 20 seconds to strip off the very thin thermal oxide films formed on the porous surface and on the inner wall surfaces of the pores in the vicinity thereof, followed by rinsing with pure water and then spin-drying.

Next, this porous silicon was heat-treated at 1,050° C. at 80 Torr for 10 minutes in an atmosphere of hydrogen (H$_2$) with a dew point of –92° C. or below, to seal the surface pores.

In this state, the substrate was taken out and its surface roughness was measured with an atomic force microscope, where undulations with an amplitude of 4 nm at periods of about 4 $\mu$m were observed. A substrate treated in the same manner but not put to this observation was brought to the subsequent step.

Next, on this porous silicon, single-crystal GaAs was epitaxially grown by MOCVD (Metal Organic Chemical Vapor Deposition) in a thickness of 1 $\mu$m. It was grown under the following conditions.

Source gas: TMGa/AsH$_3$/H$_2$
Gas pressure: 80 Torr
Temperature: 700° C.

As a result of cross-sectional observation with a transmission electron microscope, it was confirmed that no crystal defects were brought in the GaAs layer and a GaAs layer with a good crystal quality was formed. At the same time, it was also confirmed that a very clear and smooth interface was formed between the porous silicon layer sealed with silicon at its surface and the GaAs layer. A region of 50 $\mu$m square of the GaAs layer was also measured with the atomic force microscope to find the surface roughness. The surface roughness was 0.4 nm as average square roughness (Rrms), which was much smoother than the surface roughness of 3.5 nm found in an instance where the porous silicon was not formed and the GaAs layer was directly formed on the silicon substrate (an instance of off-angle of 0 degree), and was substantially equal to the surface roughness of 0.42 nm found in an instance of off-angle of 4 degrees.

Crystal defects actualized by defect-actualizing ethcing were also counted on an optical microscope to find defect density, which was found to be about 1×10$^4$/cm$^2$.

EXAMPLE 3

A p-type (replaceable with n-type) 5-inch diameter (100) single-crystal silicon substrate of 0 degree in off-angle, having a thickness of 625 $\mu$m and a specific resistance of 0.01 $\Omega \cdot$cm was anodized in a solution of HF diluted with alcohol to form a porous silicon layer on its one-side specular main surface.

The substrate was anodized under the following conditions.

Current density: 7 mA/cm$^2$
Anodizing solution: HF:H$_2$O:C$_2$H$_5$OH=1:1:1
Time: 12 minutes
Thickness of porous silicon layer: 10 $\mu$m
Porosity: 20%

Next, the resultant substrate was oxidized in an atmosphere of oxygen at 300° C. for 1 hour. As a result of this oxidation, the inner wall surfaces of porous silicon were covered with very thin thermal oxide films.

Next, this substrate was immersed in a 1.25% HF solution for 20 seconds to strip off the very thin thermal oxide films formed on the porous surface and on the inner wall surfaces of the pores in the vicinity thereof, followed by rinsing with pure water and then spin-drying.

Next, this porous silicon was heat-treated at 1,050° C. at 80 Torr for 10 minutes in an atmosphere of hydrogen (H$_2$) with a dew point of −92° C. or below to seal the surface pores, and the temperature was dropped to 700° C. as it was. On this porous silicon, single-crystal GaAs was epitaxially grown by MOCVD (Metal Organic Chemical Vapor Deposition) in a thickness of 1 $\mu$m. It was grown under the following conditions.

Source gas: TMGa/AsH$_3$/H$_2$
Gas pressure: 80 Torr
Temperature: 700° C.

As a result of cross-sectional observation with a transmission electron microscope, it was confirmed that no crystal defects were brought in the GaAs layer and a GaAs layer with a good crystal quality was formed. At the same time, it was also confirmed that a very clear and smooth interface was formed between the porous silicon layer sealed with silicon at its surface and the GaAs layer. A region of 50 $\mu$m square of the GaAs layer was also measured with an atomic force microscope to find the surface roughness. The surface roughness was 0.4 nm as average square roughness (Rrms), which was much smoother than the surface roughness of 3.5 nm found in an instance where the porous silicon was not formed and the GaAs layer was directly formed on the silicon substrate (an instance of off-angle of 0 degree), and was substantially equal to the surface roughness of 0.42 nm found in an instance of off-angle of 4 degrees.

Crystal defects actualized by defect-actualizing etching were also counted on an optical microscope to find defect density, which was found to be about 5×10$^3$/cm$^2$.

EXAMPLE 4

A p-type (replaceable with n-type) 5-inch diameter (100) single-crystal silicon substrate of 0 degree in off-angle, having a thickness of 625 $\mu$m and a specific resistance of 0.01 $\Omega \cdot$cm was anodized in a solution of HF diluted with alcohol to form a porous silicon layer on its one-side specular main surface.

The substrate was anodized under the following conditions.

Current density: 7 mA/cm$^2$
Anodizing solution: HF:H$_2$O:C$_2$H$_5$OH=1:1:1
Time: 12 minutes
Thickness of porous silicon layer: 10 $\mu$m
Porosity: 20%

Next, the resultant substrate was oxidized in an atmosphere of oxygen at 300° C. for 1 hour. As a result of this oxidation, the inner wall surfaces of porous silicon were covered with very thin thermal oxide films.

Next, this substrate was immersed in a 1.25% HF solution for 20 seconds to strip off the very thin thermal oxide films formed on the porous surface and on the inner wall surfaces of the pores in the vicinity thereof, followed by rinsing with pure water and then spin-drying.

Next, this porous silicon was heat-treated at 1,050° C. at 80 Torr for 10 minutes in an atmosphere of hydrogen (H$_2$) with a dew point of −92° C. or below to seal the surface pores, and the temperature was dropped to 700° C. as it was. On this porous silicon, single-crystal AlGaAs was epitaxially grown by MBE (Molecular Beam Epitaxy) in a thickness of 1 $\mu$m.

As a result of cross-sectional observation with a transmission electron microscope, it was confirmed that no crystal defects were brought in the AlGaAs layer and an AlGaAs layer with a good crystal quality was formed. At the same time, it was also confirmed that a very clear and smooth interface was formed between the porous silicon layer sealed with silicon at its surface and the AlGaAs layer. A region of 50 $\mu$m square of the AlGaAs layer was also measured with an atomic force microscope to find the surface roughness. The surface roughness was 0.41 nm as average square roughness (Rrms), which was much smoother than the surface roughness of 3.7 nm found in an instance where the porous silicon was not formed and the AlGaAs layer was directly formed on the silicon substrate (an instance of off-angle of 0 degree), and was substantially equal to the surface roughness of 0.42 nm found in an instance of off-angle of 4 degrees.

Crystal defects actualized by defect-actualizing etching were also counted on an optical microscope to find defect density, which was found to be about 1×10$^4$/cm$^2$.

EXAMPLE 5

A p-type (replaceable with n-type) 5-inch diameter (100) single-crystal silicon substrate of 0 degree in off-angle, having a thickness of 625 $\mu$m and a specific resistance of 0.01 $\Omega \cdot$cm was anodized in a solution of HF diluted with alcohol to form a porous silicon layer on its one-side specular main surface.

The substrate was anodized under the following conditions.

Current density: 7 mA/cm$^2$
Anodizing solution: HF:H$_2$O:C$_2$H$_5$OH=1:1:1
Time: 12 minutes
Thickness of porous silicon layer: 10 $\mu$m
Porosity: 20%

Next, the resultant substrate was oxidized in an atmosphere of oxygen at 400° C. for 1 hour. As a result of this oxidation, the inner wall surfaces of porous silicon were covered with very thin thermal oxide films.

Next, this substrate was immersed in a 1.25% HF solution for 20 seconds to strip off the very thin thermal oxide films formed on the porous surface and on the inner wall surfaces of the pores in the vicinity thereof, followed by rinsing with pure water and then spin-drying.

Next, this porous silicon was heat-treated at 1,150° C. at 760 Torr for 10 minutes in an atmosphere of hydrogen (H$_2$) with a dew point of −92° C. or below to seal the surface pores. Thereafter, on this porous silicon, single-crystal GaP was epitaxially grown by a liquid-phase growth process in a thickness of 1 $\mu$m.

As a result of cross-sectional observation with a transmission electron microscope, it was confirmed that no crystal defects were brought in the GaP layer and a GaP layer with a good crystal quality was formed. At the same time, it was also confirmed that a very clear and smooth interface was formed between the porous silicon layer sealed with silicon at its surface and the GaP layer. A region of 50 μm square of the GaP layer was also measured with an atomic force microscope to find the surface roughness. The surface roughness was 0.4 nm as average square roughness (Rrms), which was much smoother than the surface roughness of 3.5 nm found in an instance where the porous silicon was not formed and the GaP layer was directly formed on the silicon substrate (an instance of off-angle of 0 degree), and was substantially equal to the surface roughness of 0.42 nm found in an instance of off-angle of 4 degrees.

Crystal defects actualized by defect-actualizing etching were also counted on an optical microscope to find defect density, which was found to be about $1 \times 10^4/cm^2$.

EXAMPLE 6

Figure 4:
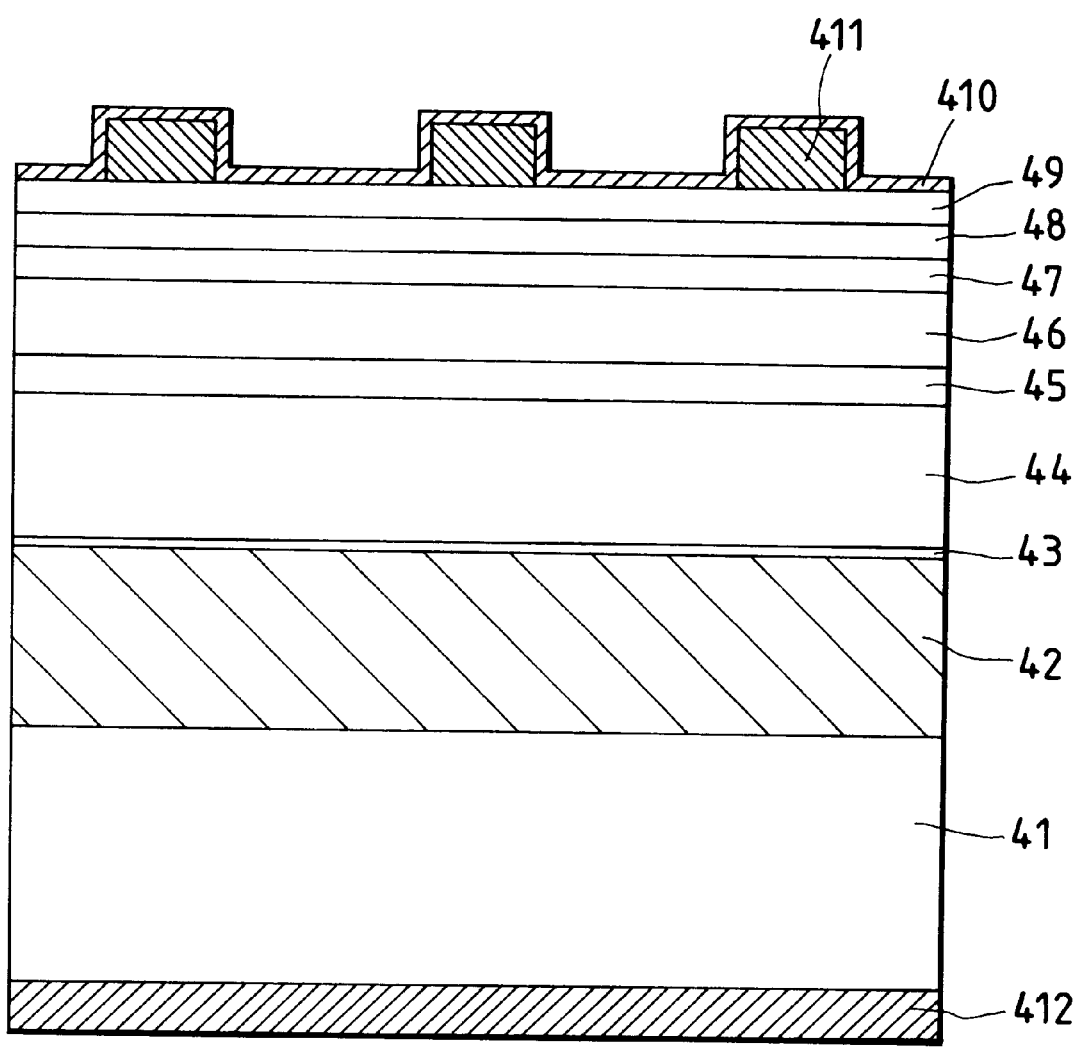
FIG. 4 is a cross-sectional view of a solar cell as a photoelectric transducer (photovoltaic device) according to the present invention.

FIG. 4 is a cross-sectional diagrammatic view of a solar cell as a photovoltaic device according to the present invention. In FIG. 4, reference numeral 41 denotes a silicon substrate; 42, a porous layer; 43, a silicon layer as the pore-sealed portion of the porous layer; 44, a p⁻-type GaAs layer; 45, a p⁺-type InGaP layer; 46, a p-type GaAs layer; 47, an n⁺-type GaAs layer; 48, an n⁺-type InGaP layer; 49, an n⁺-type AlInP layer; 410, an anti-reflection layer; and 411 and 412, first and second electrodes. A process for fabricating the device of the present Example will be described below.

A p-type 5-inch diameter (100) single-crystal silicon substrate having a thickness of 625 μm and a specific resistance of 0.01 Ω·cm was anodized in a solution of HF diluted with alcohol to form a porous silicon layer on its one-side specular main surface.

The substrate was anodized under the following conditions.

Current density: 7 mA/cm²
Anodizing solution: $HF:H_2O:C_2H_5OH=1:1:1$
Time: 12 minutes
Thickness of porous silicon layer: 10 μm
Porosity: 20%

Next, the resultant substrate was oxidized in an atmosphere of oxygen at 400° C. for 1 hour. As a result of this oxidation, the inner wall surfaces of porous silicon were covered with very thin thermal oxide films.

Next, this substrate was immersed in a 1.25% HF solution for 30 seconds to strip off the very thin thermal oxide films formed on the porous surface and on the inner wall surfaces of the pores in the vicinity thereof, followed by rinsing with pure water and then spin-drying.

Next, this porous silicon was heat-treated at 1,100° C. at 760 Torr for 10 minutes in an atmosphere of hydrogen ($H_2$) with a dew point of −92° C. or below to seal the surface pores. Thereafter, on this porous silicon, single-crystal GaAs was epitaxially grown by a liquid-phase growth process in a thickness of 5 μm.

On this layer, the p⁺-type InGaP layer, the p-type GaAs layer, the n⁺-type GaAs layer, the n⁺-type InGaP layer and the n⁺-type AlInP layer were further superposingly formed, and the first electrode and the anti-reflection layer were formed on the surface of the AlInP layer 49. On the back of the silicon substrate 41, the second electrode was formed. Thus, a solar cell was fabricated.

The fill factor of this solar cell was measured to confirm that it was 0.831 in an instance where the like structure was formed on the same single-crystal silicon substrate as the above except that the porous silicon layer was not formed; 0.807 in an instance where the porous silicon layer was formed but the pores at the porous surface were not sealed; and 0.870 in the present Example according to the present invention, showing an improvement in characteristics.

EXAMPLE 7

Figure 5:
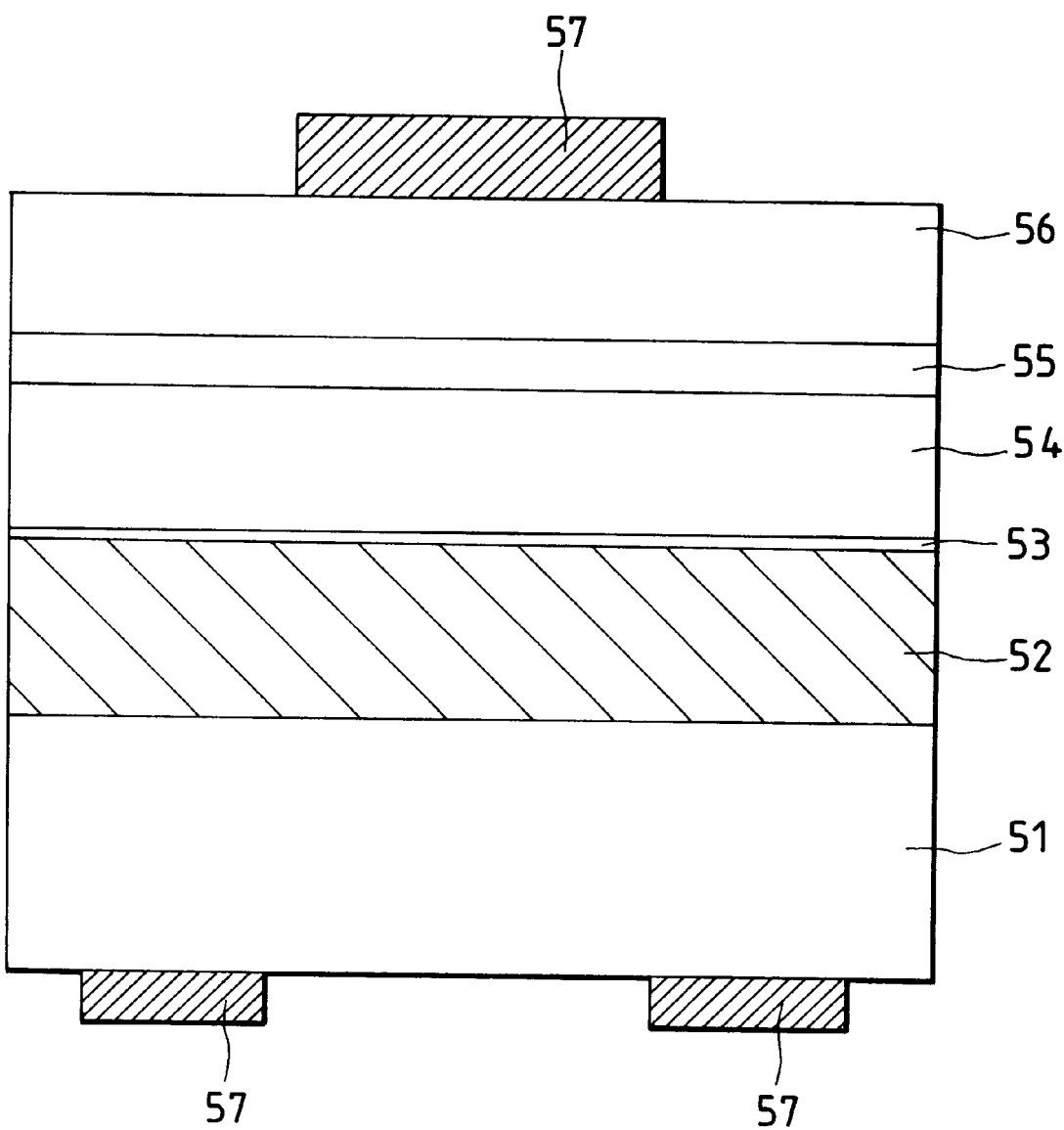
FIG. 5 is a cross-sectional view of an LED as a light-emitting device according to the present invention.

FIG. 5 is a cross-sectional diagrammatic view of an LED as a light-emitting device according to the present invention. In FIG. 5, reference numeral 51 denotes a silicon substrate; 52, a porous layer; 53, a silicon layer as the pore-sealed portion of the porous layer; 54, an n⁻-type GaAlAs layer; 55, a p⁻-type GaAlAs layer; 56, p⁻-type GaAlAs layer; and 57, electrodes. A process for fabricating the device of the present Example will be described below.

An n-type 5-inch diameter (100) single-crystal silicon substrate having a thickness of 625 μm and a specific resistance of 0.01 Ω·cm was anodized in a solution of HF diluted with alcohol to form a porous silicon layer on its one-side specular main surface.

The substrate was anodized under the following conditions.

Current density: 7 mA/cm²
Anodizing solution: $HF:H_2O:C_2H_5OH=1:1:1$
Time: 12 minutes
Thickness of porous silicon layer: 10 μm
Porosity: 20%

Next, the resultant substrate was oxidized in an atmosphere of oxygen at 400° C. for 1 hour. As a result of this oxidation, the inner wall surfaces of porous silicon were covered with very thin thermal oxide films.

Next, this substrate was immersed in a 1.25% HF solution for 30 seconds to strip off the very thin thermal oxide films formed on the porous surface and on the inner wall surfaces of the pores in the vicinity thereof, followed by rinsing with pure water and then spin-drying.

Next, this porous silicon was heat-treated at 1,100° C. at 760 Torr for 10 minutes in an atmosphere of hydrogen ($H_2$) with a dew point of −92° C. or below to seal the surface pores. Thereafter, on this porous silicon thus pore-sealed, single-crystal n⁻-type GaAs was epitaxially grown by a liquid-phase growth process in a thickness of 5 μm.

The n⁻-type GaAlAs layer and the p⁻-type GaAlAs layer were further superposingly formed thereon, and first and second electrodes were formed on the surface of the GaAlAs layer 56 and the back of the silicon substrate 51, respectively. Thus, a light-emitting diode was fabricated. As a result, red-light emission at an intensity equivalent to that of an instance where such device structure was formed on a GaAs substrate.

EXAMPLE 8

Figure 6:
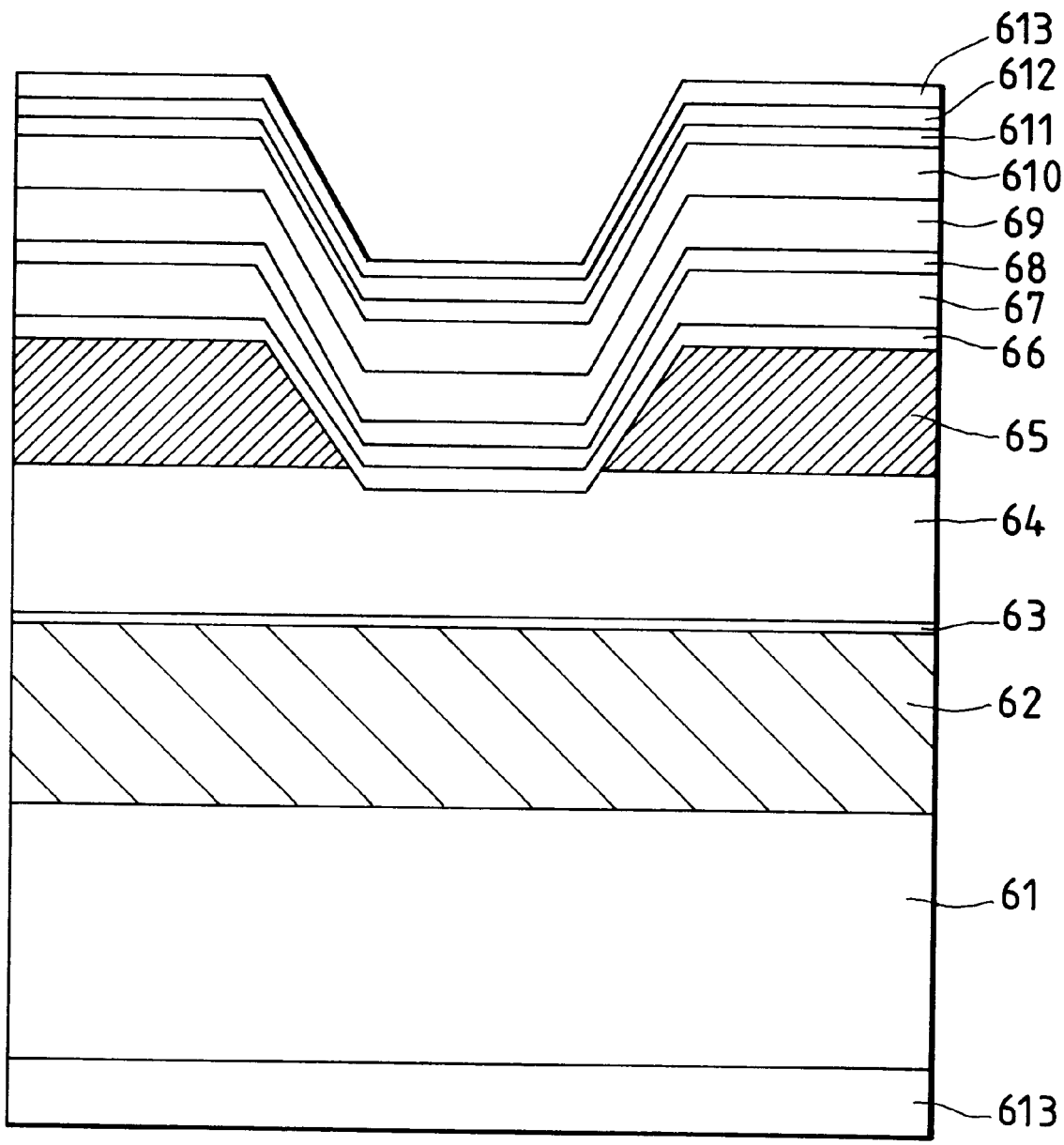
FIG. 6 is a cross-sectional view of a semiconductor laser as a light-emitting device according to the present invention.

FIG. 6 is a cross-sectional diagrammatic view of a semiconductor laser as a light-emitting device according to the present invention. In FIG. 6, reference numeral 61 denotes a silicon substrate; 62, a porous layer; 63, a silicon layer as the pore-sealed portion of the porous layer; 64, an n⁻-type GaAs layer; 65, a p⁻-type GaAs layer; 66, an n⁻-type ZnSe buffer layer; 67, an n⁻-type ZnMgSSe layer; 68, a ZnSSe/ZnCdSe layer; 69, a p⁻-type ZnMgSSe layer; 610, a p⁻-type ZnSe layer; 611, a p⁻-type ZnSe/ZnTe layer; 612, a p⁻-type ZnTe layer; and 613, electrodes. A process for fabricating the device of the present Example will be described below.

An n-type 5-inch diameter (100) single-crystal silicon substrate having a thickness of 625 μm and a specific resistance of 0.01 Ω·cm was anodized in a solution of HF diluted with alcohol to form a porous silicon layer on its one-side specular main surface.

The substrate was anodized under the following conditions.

Current density: 7 mA/cm$^2$
Anodizing solution: HF:H$_2$O:C$_2$H$_5$OH=1:1:1
Time: 12 minutes
Thickness of porous silicon layer: 10 μm
Porosity: 20%

Next, the resultant substrate was oxidized in an atmosphere of oxygen at 400° C. for 1 hour. As a result of this oxidation, the inner wall surfaces of porous silicon were covered with very thin thermal oxide films.

Next, this substrate was immersed in a 1.25% HF solution for 30 seconds to strip off the very thin thermal oxide films formed on the porous surface and on the inner wall surfaces of the pores in the vicinity thereof, followed by rinsing with pure water and then spin-drying.

Next, this porous silicon was heat-treated at 1,000° C. at 10 Torr for 10 minutes in an atmosphere of hydrogen (H$_2$) with a dew point of −92° C. or below to seal the surface pores. Thereafter, on this porous silicon, single-crystal n$^-$-type GaAs was epitaxially grown by MBE in a thickness of 5 μm.

The p$^-$-type GaAs layer and the n$^-$-type ZnSe layer were further superposingly formed thereon, and then the n$^-$-type ZnSe layer was patterned and removed in stripes. Thereafter, the n-type ZnMgSSe layer, the ZnSSe/ZnCdSe layer, the p$^-$-type ZnMgSSe layer, the p$^-$-type ZnSe layer, the p$^-$-type ZnSe/ZnTe layer, and the p$^-$-type ZnTe layer were further formed thereon. On the surface of the uppermost layer, a first An/Pt/Pd electrode was formed, and on the back a second In electrode, then a pulse voltage was applied. As a result, light was emitted at room temperature like an instance where such device structure was formed on a GaAs substrate. The threshold current density was 210 A/cm$^2$ in either case.

EXAMPLE 9

FIG. 7 is a cross-sectional diagrammatic view of an HEMT (High Electron Mobility Transistor) as a transistor according to the present invention. In FIG. 7, reference numeral 71 denotes a silicon substrate; 72, a porous layer; 73, a silicon layer as the pore-sealed portion of the porous layer; 74, a single-crystal GaAs layer; 75, a non-doped GaAs layer; 76, an n-type AlGaAs layer; 77, an n-type GaAs layer; 78, an AuGe source electrode; 79, an Al gate electrode; and 710, an AuGe drain. A process for fabricating the device of the present Example will be described below.

An n-type 5-inch diameter (100) single-crystal silicon substrate having a thickness of 625 μm and a specific resistance of 0.01 Ω·cm was anodized in a solution of HF diluted with alcohol to form a porous silicon layer on its one-side specular main surface.

The substrate was anodized under the following conditions.

Current density: 7 mA/cm$^2$
Anodizing solution: HF:H$_2$O:C$_2$H$_5$OH=1:1:1
Time: 12 minutes
Thickness of porous silicon layer: 10 μm
Porosity: 20%

Next, the resultant substrate was oxidized in an atmosphere of oxygen at 400° C. for 1 hour. As a result of this oxidation, the inner wall surfaces of porous silicon were covered with very thin thermal oxide films.

Next, this substrate was immersed in a 1.25% HF solution for 30 seconds to strip off the very thin thermal oxide films formed on the porous surface and on the inner wall surfaces of the pores in the vicinity thereof, followed by rinsing with pure water and then spin-drying.

Next, this porous silicon was heat-treated at 1,000° C. at 1 Torr for 10 minutes in an atmosphere of hydrogen (H$_2$) with a dew point of −92° C. or below to seal the surface pores. Thereafter, on this porous silicon, single-crystal GaAs was epitaxially grown by MBE in a thickness of 5 μm.

The non-doped GaAs layer, the n-type AlGaAs layer and the n-type GaAs layer were further formed thereon. The gate, the source and the drain were fabricated thereon to set up an HEMT. As a result, it operated at a high speed like an instance where such device structure was formed on a GaAs substrate.

EXAMPLE 10

Two substrates among three p-type (replaceable with n-type) 6-inch diameter (100) single-crystal silicon substrates each having a thickness of 615 μm and a specific resistance of 0.01 Ω·cm were anodized in a solution of HF diluted with alcohol to form porous silicon layers on its one-side specular main surfaces.

The substrates were anodized under the following conditions.

Current density: 7 mA/cm$^2$
Anodizing solution: HF:H$_2$O:C$_2$H$_5$OH=1:1:1
Time: 12 minutes
Thickness of porous silicon layer: 10 μm
Porosity: 20%

Next, the resultant substrates were oxidized in an atmosphere of oxygen at 400° C. for 1 hour. As a result of this oxidation, the inner wall surfaces of porous silicon were covered with very thin thermal oxide films.

Next, one of these substrates was heat-treated at 1,050° C. at 760 Torr for 1 minute while flowing 230 l/min of H$_2$ and further heat-treated for 5 minutes with addition of 50 sccm of SiH$_4$, to seal the surface pores.

Next, on these three pre-treated or non-treated (100) silicon substrates, single-crystal GaAs was epitaxially grown by MOCVD (Metal Organic Chemical Vapor Deposition) in a thickness of 1 μm. It was grown under the following conditions.

Source gas: TMGa/AsH$_3$/H$_2$
Gas pressure: 80 Torr
Temperature: 700° C.

As a result of cross-sectional observation with a transmission electron microscope, it was confirmed that no crystal defects were brought in the GaAs layer formed on the porous silicon heat-treated with addition of SiH$_4$ and a GaAs layer with a good crystal quality was formed. At the same time, it was also confirmed that a very clear and smooth interface was formed between the porous silicon layer sealed with silicon at its surface and the GaAs layer. With regard to the substrate on which the porous surface was formed but the GaAs layer was formed without the heat treatment with addition of SiH$_4$, cross-sectional observation with an electron microscope revealed that the interface between the porous silicon and the GaAs layer was in a disorder with a difference in height of about 100 nm. As for the instance where the GaAs layer was formed directly on the silicon substrate without forming the porous layer, it was confirmed that countless twin defects, stacking faults and dislocations were brought in the GaAs layer from the Si/GaAs interface.

A region of 50 µm square of the GaAs layer was also measured with an atomic force microscope to find the surface roughness. The roughness of the surface of the substrate heat-treated in an atmosphere of hydrogen with a dew point of −95° C. and on which the compound semiconductor layer was formed was 0.3 nm as average square roughness (Rrms), which was much smoother than the surface roughness of 3.5 nm found in an instance where the porous silicon was not formed and the GaAs layer was directly formed on the silicon substrate (an instance of off-angle of 0 degree), and was better than the surface roughness of 0.42 nm found in an instance of off-angle of 4 degrees.

Crystal defects actualized by defect-actualizing etching were also counted on an optical microscope to find defect density, which was found to be about $1 \times 10^4 / cm^2$.

Meanwhile, in the instance where the porous layer was not formed, the defect density was as high as about $1 \times 10^6 / cm^2$, and in the instance where the porous layer was formed but was not heat-treated with addition of $SiH_4$, it was about $1 \times 10^5 / cm^2$.

EXAMPLE 11

A p-type (replaceable with n-type) 5-inch diameter (100) single-crystal silicon substrate of 0 degree in off-angle, having a thickness of 625 µm and a specific resistance of 0.01 Ω·cm was anodized in a solution of HF diluted with alcohol to form a porous silicon layer on its one-side specular main surface.

The substrate was anodized under the following conditions.

Current density: 7 mA/cm$^2$
Anodizing solution: $HF:H_2O:C_2H_5OH=1:1:1$
Time: 12 minutes
Thickness of porous silicon layer: 10 µm
Porosity: 20%

Next, the resultant substrate was oxidized in an atmosphere of oxygen at 300° C. for 1 hour. As a result of this oxidation, the inner wall surfaces of porous silicon were covered with very thin thermal oxide films.

Next, this substrate was immersed in a 1.25% HF solution for 20 seconds to strip off the very thin thermal oxide films formed on the porous surface and on the inner wall surfaces of the pores in the vicinity thereof, followed by rinsing with pure water and then spin-drying.

Next, this porous silicon was heat-treated at 1,050° C. at 80 Torr for 10 minutes in an atmosphere of hydrogen ($H_2$) while adding 20 sccm of $SiH_4$, to seal the surface pores.

In this state, the substrate was taken out and its surface roughness was measured with an atomic force microscope, where undulations with an amplitude of 4 nm at periods of about 4 µm were observed. A substrate treated in the same manner but not put to this observation was brought to the subsequent step.

Next, on this porous silicon, single-crystal GaAs was epitaxially grown by MOCVD (Metal Organic Chemical Vapor Deposition) in a thickness of 1 µm. It was grown under the following conditions.

Source gas: $TMGa/AsH_3/H_2$
Gas pressure: 80 Torr
Temperature: 700° C.

As a result of cross-sectional observation with a transmission electron microscope, it was confirmed that no crystal defects were brought in the GaAs layer and a GaAs layer with a good crystal quality was formed. At the same time, it was also confirmed that a very clear and smooth interface was formed between the porous silicon layer sealed with silicon at its surface and the GaAs layer. A region of 50 µm square of the GaAs layer was also measured with the atomic force microscope to find the surface roughness. The surface roughness was 0.4 nm as average square roughness (Rrms), which was much smoother than the surface roughness of 3.5 nm found in an instance where the porous silicon was not formed and the GaAs layer was directly formed on the silicon substrate (an instance of off-angle of 0 degree), and was substantially equal to the surface roughness of 0.42 nm found in an instance of off-angle of 4 degrees.

Crystal defects actualized by defect-actualizing ethcing were also counted on an optical microscope to find defect density, which was found to be about $5 \times 10^3 / cm^2$.

EXAMPLE 12

A p-type (replaceable with n-type) 5-inch diameter (100) single-crystal silicon substrate of 0 degree in off-angle, having a thickness of 625 µm and a specific resistance of 0.01 Ω·cm was anodized in a solution of HF diluted with alcohol to form a porous silicon layer on its one-side specular main surface.

The substrate was anodized under the following conditions.

Current density: 7 mA/cm$^2$
Anodizing solution: $HF:H_2O:C_2H_5OH=1:1:1$
Time: 12 minutes
Thickness of porous silicon layer: 10 µm
Porosity: 20%

Next, the resultant substrate was oxidized in an atmosphere of oxygen at 300° C. for 1 hour. As a result of this oxidation, the inner wall surfaces of porous silicon were covered with very thin thermal oxide films.

Next, this porous silicon was heat-treated at 1,050° C. at 80 Torr for 5 minutes in an atmosphere of hydrogen ($H_2$) and subsequently heat-treated for 5 minutes with addition of 20 sccm of $SiH_2Cl_2$, to seal the surface pores. The temperature was dropped to 700° C. as it was. On this porous silicon, single-crystal GaAs was epitaxially grown by MOCVD (Metal Organic Chemical Vapor Deposition) in a thickness of 1 µm. It was grown under the following conditions.

Source gas: $TMGa/AsH_3/H_2$
Gas pressure: 80 Torr
Temperature: 700° C.

As a result of cross-sectional observation with a transmission electron microscope, it was confirmed that no crystal defects were brought in the GaAs layer and a GaAs layer with a good crystal quality was formed. At the same time, it was also confirmed that a very clear and smooth interface was formed between the porous silicon layer sealed with silicon at its surface and the GaAs layer. A region of 50 µm square of the GaAs layer was also measured with an atomic force microscope to find the surface roughness. The surface roughness was 0.4 nm as average square roughness (Rrms), which was much smoother than the surface roughness of 3.5 nm found in an instance where the porous silicon was not formed and the GaAs layer was directly formed on the silicon substrate (an instance of off-angle of 0 degree), and was substantially equal to the surface roughness of 0.42 nm found in an instance of off-angle of 4 degrees.

Crystal defects actualized by defect-actualizing ethcing were also counted on an optical microscope to find defect density, which was found to be about $5 \times 10^3 / cm^2$.

EXAMPLE 13

A p-type (replaceable with n-type) 5-inch diameter (100) single-crystal silicon substrate of 0 degree in off-angle, having a thickness of 625 µm and a specific resistance of 0.01 Ω·cm was anodized in a solution of HF diluted with alcohol to form a porous silicon layer on its one-side specular main surface.

The substrate was anodized under the following conditions.

Current density: 7 mA/cm$^2$
Anodizing solution: HF:H$_2$O:C$_2$H$_5$OH=1:1:1
Time: 12 minutes
Thickness of porous silicon layer: 10 µm
Porosity: 20%

Next, this substrate was immersed in a 1.25% HF solution for 20 seconds to strip off very thin oxide films formed on the porous surface and on the inner wall surfaces of the pores in the vicinity thereof, followed by rinsing with pure water and then spin-drying.

Next, this porous silicon was heat-treated at 950° C. at 20 Torr for 10 minutes in an atmosphere of hydrogen (H$_2$) while adding 30 sccm of SiH$_4$, to seal the surface pores, and the temperature was dropped to 700° C. as it was. On this porous silicon, after supply gases were changed, single-crystal AlGaAs was epitaxially grown by MBE (Molecular Beam Epitaxy) in a thickness of 1 µm.

As a result of cross-sectional observation with a transmission electron microscope, it was confirmed that no crystal defects were brought in the AlGaAs layer and an AlGaAs layer with a good crystal quality was formed. At the same time, it was also confirmed that a very clear and smooth interface was formed between the porous silicon layer sealed with silicon at its surface and the AlGaAs layer. A region of 50 µm square of the AlGaAs layer was also measured with an atomic force microscope to find the surface roughness. The surface roughness was 0.41 nm as average square roughness (Rrms), which was much smoother than the surface roughness of 3.7 nm found in an instance where the porous silicon was not formed and the AlGaAs layer was directly formed on the silicon substrate (an instance of off-angle of 0 degree), and was substantially equal to the surface roughness of 0.42 nm found in an instance of off-angle of 4 degrees.

Crystal defects actualized by defect-actualizing etching were also counted on an optical microscope to find defect density, which was found to be about 7×10$^3$/cm$^2$.

EXAMPLE 14

A p-type (replaceable with n-type) 5-inch diameter (100) single-crystal silicon substrate of 0 degree in off-angle, having a thickness of 625 µm and a specific resistance of 0.01 Ω·cm was anodized in a solution of HF diluted with alcohol to form a porous silicon layer on its one-side specular main surface.

The substrate was anodized under the following conditions.

Current density: 7 mA/cm$^2$
Anodizing solution: HF:H$_2$O:C$_2$H$_5$OH=1:1:1
Time: 12 minutes
Thickness of porous silicon layer: 10 µm
Porosity: 20%

Next, this substrate was immersed in a 1.25% HF solution for 20 seconds to strip off very thin oxide films formed on the porous surface and on the inner wall surfaces of the pores in the vicinity thereof, followed by rinsing with pure water and then spin-drying.

Next, this porous silicon was heat-treated at 1,100° C. at 760 Torr for 10 minutes in an atmosphere of 4%-H$_2$:96%-Ar while adding 30 sccm of SiH$_4$, to seal the surface pores, and the temperature was dropped to 700° C. as it was. On this porous silicon, after supply gases were changed, single-crystal AlGaAs was epitaxially grown by MBE (Molecular Beam Epitaxy) in a thickness of 1 µm.

As a result of cross-sectional observation with a transmission electron microscope, it was confirmed that no crystal defects were brought in the AlGaAs layer and an AlGaAs layer with a good crystal quality was formed. At the same time, it was also confirmed that a very clear and smooth interface was formed between the porous silicon layer sealed with silicon at its surface and the AlGaAs layer. A region of 50 µm square of the AlGaAs layer was also measured with an atomic force microscope to find the surface roughness. The surface roughness was 0.41 nm as average square roughness (Rrms), which was much smoother than the surface roughness of 3.7 nm found in an instance where the porous silicon was not formed and the AlGaAs layer was directly formed on the silicon substrate (an instance of off-angle of 0 degree), and was substantially equal to the surface roughness of 0.42 nm found in an instance of off-angle of 4 degrees.

Crystal defects actualized by defect-actualizing etching were also counted on an optical microscope to find defect density, which was found to be about 7×10$^3$/cm$^2$.

EXAMPLE 15

A p-type (replaceable with n-type) 5-inch diameter (100) single-crystal silicon substrate of 0 degree in off-angle, having a thickness of 625 µm and a specific resistance of 0.01 Ω·cm was anodized in a solution of HF diluted with alcohol to form a porous silicon layer on its one-side specular main surface.

The substrate was anodized under the following conditions.

Current density: 7 mA/cm$^2$
Anodizing solution: HF:H$_2$O:C$_2$H$_5$OH=1:1:1
Time: 12 minutes
Thickness of porous silicon layer: 10 µm
Porosity: 20%

Next, the resultant substrate was oxidized in an atmosphere of oxygen at 300° C. for 1 hour. As a result of this oxidation, the inner wall surfaces of porous silicon were covered with very thin thermal oxide films.

Next, this porous silicon was heat-treated at 1,150° C. for 10 minutes in ultra-high vacuum with a degree of ultimate vacuum of 1×10$^{-10}$ Torr while supplying a trace amount of silicon, to seal the surface pores. Thereafter, on this porous silicon, single-crystal GaP was epitaxially grown by a liquid-phase growth process in a thickness of 1 µm.

As a result of cross-sectional observation with a transmission electron microscope, it was confirmed that no crystal defects were brought in the GaP layer and an GaP layer with a good crystal quality was formed. At the same time, it was also confirmed that a very clear and smooth interface was formed between the porous silicon layer sealed with silicon at its surface and the GaP layer. A region of 50 µm square of the GaP layer was also measured with an atomic force microscope to find the surface roughness. The surface roughness was 0.4 nm as average square roughness (Rrms), which was much smoother than the surface roughness of 3.5 nm found in an instance where the porous silicon was not formed and the GaP layer was directly formed on the silicon substrate (an instance of off-angle of 0 degree), and was substantially equal to the surface roughness of 0.42 nm found in an instance of off-angle of 4 degrees.

Crystal defects actualized by defect-actualizing etching were also counted on an optical microscope to find defect density, which was found to be about $1 \times 10^4/cm^2$.

EXAMPLE 16

A solar cell as a photovoltaic device according to the present invention has the same constitution as that shown in FIG. 4. Reference numeral 41 denotes a silicon substrate; 42, a porous layer; 43, a silicon layer as the pore-sealed portion of the porous layer; 44, a p⁻-type GaAs layer; 45, a p⁺-type InGaP layer; 46, a p-type GaAs layer; 47, an n⁺-type GaAs layer; 48, an n⁺-type InGaP layer; 49, an n⁺-type AlInP layer; 410, an anti-reflection layer; and 411 and 412, first and second electrodes.

A process for fabricating the device of the present Example will be described below.

A p-type 5-inch diameter (100) single-crystal silicon substrate having a thickness of 625 μm and a specific resistance of 0.01 Ω·cm was anodized in a solution of HF diluted with alcohol to form a porous silicon layer on its one-side specular main surface.

The substrate was anodized under the following conditions.

Current density: 7 mA/cm²
Anodizing solution: HF:H₂O:C₂H₅OH=1:1:1
Time: 12 minutes
Thickness of porous silicon layer: 10 μm
Porosity: 20%

Next, the resultant substrate was oxidized in an atmosphere of oxygen at 400° C. for 1 hour. As a result of this oxidation, the inner wall surfaces of porous silicon were covered with very thin thermal oxide films.

Next, this substrate was immersed in a 1.25% HF solution for 30 seconds to strip off the very thin thermal oxide films formed on the porous surface and on the inner wall surfaces of the pores in the vicinity thereof, followed by rinsing with pure water and then spin-drying.

Next, this porous silicon was heat-treated at 1,100° C. at 760 Torr for 1 minute in an atmosphere of hydrogen (H₂) and subsequently heat-treated for 5 minutes with addition of 20 sccm of SiH₂Cl₂, to seal the surface pores. Thereafter, on this porous silicon, single-crystal GaAs was epitaxially grown by a liquid-phase growth process in a thickness of 5 μm.

On this layer, the p⁺-type InGaP layer, the p-type GaAs layer, the n⁺-type GaAs layer, the n⁺-type InGaP layer and the n⁺-type AlInP layer were further superposingly formed, and the first electrode and the anti-reflection layer were formed on the surface of the AlInP layer 49. On the back of the silicon substrate 41, the second electrode was formed. Thus, a solar cell was fabricated.

The fill factor of this solar cell was measured to confirm that it was 0.831 in an instance where the like structure was formed on the same single-crystal silicon substrate as the above except that the porous silicon layer was not formed; 0.807 in an instance where the porous silicon layer was formed but the pores at the porous surface were not sealed; and 0.870 in the present Example according to the present invention, showing an improvement in characteristics.

EXAMPLE 17

An LED as a light-emitting device according to the present invention has the same constitution as that shown in FIG. 5. Reference numeral 51 denotes a silicon substrate; 52, a porous layer; 53, a silicon layer as the pore-sealed portion of the porous layer; 54, an n⁻-type GaAlAs layer; 55, a p⁻-type GaAlAs layer; 56, p⁻-type GaAlAs layer; and 57, electrodes. A process for fabricating the device of the present Example will be described below.

An n-type 5-inch diameter (100) single-crystal silicon substrate having a thickness of 625 μm and a specific resistance of 0.01 Ω·cm was anodized in a solution of HF diluted with alcohol to form a porous silicon layer on its one-side specular main surface.

The substrate was anodized under the following conditions.

Current density: 7 mA/cm²
Anodizing solution: HF:H₂O:C₂H₅OH=1:1:1
Time: 12 minutes
Thickness of porous silicon layer: 10 μm
Porosity: 20%

Next, the resultant substrate was oxidized in an atmosphere of oxygen at 400° C. for 1 hour. As a result of this oxidation, the inner wall surfaces of porous silicon were covered with very thin thermal oxide films.

Next, this substrate was immersed in a 1.25% HF solution for 30 seconds to strip off the very thin thermal oxide films formed on the porous surface and on the inner wall surfaces of the pores in the vicinity thereof, followed by rinsing with pure water and then spin-drying.

Next, this porous silicon was heat-treated at 1,100° C. at 760 Torr for 1 minute in an atmosphere of hydrogen (H₂) and subsequently heat-treated continuously for 6 minutes with addition of 20 sccm of SiH₄, to seal the surface pores.

Thereafter, on this porous silicon thus pore-sealed, single-crystal n⁻-type GaAs was epitaxially grown by a liquid-phase growth process in a thickness of 5 μm.

The n⁻-type GaAlAs layer and the p⁻-type GaAlAs layer were further superposingly formed thereon, and first and second electrodes were formed on the surface of the GaAlAs layer 56 and the back of the silicon substrate 51, respectively. Thus, a light-emitting diode was fabricated. As a result, red-light emission at an intensity equivalent to that of an instance where such device structure was formed on a GaAs substrate.

EXAMPLE 18

A semiconductor laser as a light-emitting device according to the present invention has the same constitution as that shown in FIG. 6. Reference numeral 61 denotes a silicon substrate; 62, a porous layer; 63, a silicon layer as the pore-sealed portion of the porous layer; 64, an n⁻-type GaAs layer; 65, a p⁻-type GaAs layer; 66, an n⁻-type ZnSe buffer layer; 67, an n⁻-type ZnMgSSe layer; 68, a ZnSSe/ZnCdSe layer; 69, a p⁻-type ZnMgSSe layer; 610, a p⁻-type ZnSe layer; 611, a p⁻-type ZnSe/ZnTe layer; 612, a p⁻-type ZnTe layer; and 613, electrodes. A process for fabricating the device of the present Example will be described below.

An n-type 5-inch diameter (100) single-crystal silicon substrate having a thickness of 625 μm and a specific resistance of 0.01 Ω·cm was anodized in a solution of HF diluted with alcohol to form a porous silicon layer on its one-side specular main surface.

The substrate was anodized under the following conditions.

Current density: 7 mA/cm²
Anodizing solution: HF:H₂O:C₂H₅OH=1:1:1
Time: 12 minutes
Thickness of porous silicon layer: 10 μm Porosity: 20%

Next, the resultant substrate was oxidized in an atmosphere of oxygen at 400° C. for 1 hour. As a result of this oxidation, the inner wall surfaces of porous silicon were covered with very thin thermal oxide films.

Next, this substrate was immersed in a 1.25% HF solution for 30 seconds to strip off the very thin thermal oxide films formed on the porous surface and on the inner wall surfaces of the pores in the vicinity thereof, followed by rinsing with pure water and then spin-drying.

Next, this porous silicon was heat-treated at 1,100° C. at 760 Torr for 1 minute in an atmosphere of hydrogen ($H_2$) and subsequently heat-treated continuously for 6 minutes with addition of 20 sccm of $SiH_4$, to seal the surface pores.

Thereafter, on this porous silicon, single-crystal n$^-$-type GaAs was epitaxially grown by MBE in a thickness of 5 μm.

The p$^-$-type GaAs layer and the n$^-$-type ZnSe layer were further superposingly formed thereon, and then the n-type ZnSe was patterned and removed in stripes. Thereafter, the n-type ZnMgSSe layer, the ZnSSe/ZnCdSe layer, the p$^-$-type ZnMgSSe layer, the p$^-$-type ZnSe layer, the p$^-$-type ZnSe/ZnTe layer, and the p$^-$-type ZnTe layer were further formed thereon. On the surface of the uppermost layer, a first An/Pt/Pd electrode was formed, and on the back a second In electrode, then a pulse voltage was applied. As a result, light was emitted at room temperature like an instance where such device structure was formed on a GaAs substrate. The threshold current density was 210 A/cm$^2$ in either case.

EXAMPLE 19

An HEMT (High Electron Mobility Transistor) as a transistor according to the present invention has the same constitution as that shown in FIG. 7. Reference numeral 71 denotes a silicon substrate; 72, a porous layer; 73, a silicon layer as the pore-sealed portion of the porous layer; 74, a single-crystal GaAs layer; 75, a non-doped GaAs layer; 76, an n-type AlGaAs layer; 77, an n-type GaAs layer; 78, a source electrode; 79, a gate electrode; and 710, a drain. A process for fabricating the device of the present Example will be described below.

An n-type 5-inch diameter (100) single-crystal silicon substrate having a thickness of 625 μm and a specific resistance of 0.01 Ω·cm was anodized in a solution of HF diluted with alcohol to form a porous silicon layer on its one-side specular main surface.

The substrate was anodized under the following conditions.

Current density: 7 mA/cm$^2$
Anodizing solution: $HF:H_2O:C_2H_5OH=1:1:1$
Time: 12 minutes
Thickness of porous silicon layer: 10 μm
Porosity: 20%

Next, the resultant substrate was oxidized in an atmosphere of oxygen at 400° C. for 1 hour. As a result of this oxidation, the inner wall surfaces of porous silicon were covered with very thin thermal oxide films.

Next, this substrate was immersed in a 1.25% HF solution for 30 seconds to strip off the very thin thermal oxide films formed on the porous surface and on the inner wall surfaces of the pores in the vicinity thereof, followed by rinsing with pure water and then spin-drying.

Next, this porous silicon was heat-treated at 1,000° C. at 1 Torr for 5 minutes in an atmosphere of hydrogen ($H_2$) while adding 10 sccm of $SiH_4$, to seal the surface pores. Thereafter, on this porous silicon, single-crystal GaAs was epitaxially grown by MBE in a thickness of 5 μm.

The non-doped GaAs layer, the n-type AlGaAs layer and the n-type GaAs layer were further formed thereon. The gate, the source and the drain were fabricated thereon to set up an HEMT. As a result, it operated at a high speed like an instance where such device structure was formed on a GaAs substrate.

As described above in detail, according to the present invention, the semiconductor device, the semiconductor substrate and the process for its production can be provided which can overcome the problems the prior art has had. More specifically, compound semiconductor substrates with a high quality can be produced using inexpensive silicon substrates, and, using such substrates, compound semiconductor devices with good characteristics can be fabricated at a low cost.

In the present invention, when the single-crystal compound semiconductor layer is formed on the porous silicon substrate, the substrate is heat-treated in an atmosphere containing hydrogen, whereby the single-crystal compound semiconductor layer improved in crystal quality and surface smoothness having been questioned in the prior art can be formed on the silicon substrate.

In addition, according to the present invention, the compound semiconductor layer having a smooth surface, a good crystal quality and a clear and smooth interface between the substrate and the compound semiconductor layer can be formed even without use of the single-crystal silicon substrate having off-angles necessary for obtaining a smooth surface. In particular, limitations on substrates can be lessened because, e.g., silicon substrates having an off-angle of about (100) ±1° can be used which are widely circulated in the market of substrates having low off-angles.

According to the present invention, the compound semiconductor layer with a good crystal quality can be formed on the silicon substrate surpassingly in view of productivity, uniformity, controllability and economical advantages.

According to the present invention, the semiconductor substrate production process can be proposed which can be applied to conventional compound semiconductor devices while ensuring their advantages.

According to the present invention, the pores at the surface of porous silicon formed by processing a silicon substrate originally having a good crystal quality are sealed by heat-treating the substrate in an atmosphere of hydrogen, to form the single-crystal compound-semiconductor layer with a good quality. Thus, a large number of substrates can be processed at one time, and their crystal quality can be improved to a level comparable to or higher than that of single-crystal compound-semiconductor substrates themselves without lowering their productivity and economical advantages.

According to the present invention, the pores at the surface of porous silicon formed by processing a silicon substrate originally having a good crystal quality are sealed by heat-treating the substrate in an atmosphere of hydrogen, to form a single-crystal compound-semiconductor layer over a large area at one time. Thus, photoelectric transducers such as solar cells and photosensors, light-emitting devices such as lasers and light-emitting diodes and transistors such as HEMTs can be formed on such single-crystal compound-semiconductor layers while ensuring the characteristics comparable to instances where they are formed on single-crystal compound-semiconductor substrates themselves, and also these can be formed surpassingly in view of productivity, uniformity, controllability and economical advantages.

What is claimed is:

1. A process for producing a semiconductor substrate, comprising the steps of:

heat-treating a silicon substrate having a porous region, to seal pores at the surface of the porous region, whereby the surface of the porous region is provided with undulations of from 0.5 μm to 50 μm in period; and forming a single-crystal compound-semiconductor layer by heteroepitaxial growth directly on an entire surface of the porous region having the pores sealed by the heat treatment.

2. The process for producing a semiconductor substrate according to claim 1, wherein the silicon substrate is heat-treated in an atmosphere substantially free of a gas containing silicon.

3. The process for producing a semiconductor substrate according to claim 1, which further comprises, before the heat-treating step;

the step of removing a native oxide film from the surface of the porous region.

4. The process for producing a semiconductor substrate according to claim 1, which further comprises, before the heat-treating step;

the step of oxidizing inner walls of the pores in the porous region to such an extent that single-crystal silicon remains in the interiors.

5. The process for producing a semiconductor substrate according to claim 4, which further comprises, before the heat-treating step;

the step of removing an oxide film from the surface of the porous region.

6. The process for producing a semiconductor substrate according to claim 1, wherein the heat-treating step is the step of heat-treating the silicon substrate in an atmosphere of hydrogen with a dew point of −92° C. or below.

7. The process for producing a semiconductor substrate according to claim 3 or 5, wherein the step of removing an oxide film or a natural oxide film from the surface of the porous region is carried out by immersing in a hydrofluoric acid solution the silicon substrate having the porous region.

8. The process for producing a semiconductor substrate according to claim 1, wherein the silicon substrate has a main plane having a plane direction (100).

9. The process for producing a semiconductor substrate according to claim 1, wherein the heat-treating step is carried out in an atmosphere containing a trace amount of silicon.

10. The process for producing a semiconductor substrate according to claim 9, wherein the heat-treating step is carried out in an atmosphere of hydrogen or in an atmosphere of hydrogen and an inert gas.

11. The process for producing a semiconductor substrate according to claim 9, wherein the silicon substrate having the porous region is heat-treated in an atmosphere of hydrogen with a dew point of −92° C. or below.

12. The process for producing a semiconductor substrate according to claim 9, wherein the silicon substrate having the porous region is immersed in a hydrofluoric acid solution to remove an oxide film or a natural oxide film from the surface of the porous region, and the silicon substrate having the porous region is heat-treated in an atmosphere of hydrogen with a dew point of −92° C. or below.

* * * * *

UNITED STATES PATENT AND TRADEMARK OFFICE
CERTIFICATE OF CORRECTION

PATENT NO. : 6,106,613
DATED : August 22, 2000
INVENTOR(S) : Nobuhiko Sato et al.

It is certified that error appears in the above-identified patent and that said Letters Patent is hereby corrected as shown below:

Column 1,
Line 12, "form d" should read --formed--;
Line 13, "d ices" should read --devices--;
Line 24, "mat rials" should read --materials--;
Line 25, "a d" should read --and--.

Column 6,
Line 23, "al," should read --al.,--;
Line 37, "know," should read --now,--.

Column 8,
Line 2, "much" should be deleted;
Line 24, "unwated" should read --unwanted--.

Column 9,
Line 27, "less depend" should read --depend less--;
Line 49, "so set" should read --set so--.

Column 11,
Line 63, "ethcing" should read --etching--.

Column 12,
Line 61, "ethcing" should read --etching--.

Column 13
Line 47, "ethcing" should read --etching--.

Column 14
Line 32, "ethcing" should read --etching--.

UNITED STATES PATENT AND TRADEMARK OFFICE
CERTIFICATE OF CORRECTION

PATENT NO. : 6,106,613
DATED : August 22, 2000
INVENTOR(S) : Nobuhiko Sato et al.

It is certified that error appears in the above-identified patent and that said Letters Patent is hereby corrected as shown below:

Column 15,
Line 15, "ethcing" should read --etching--.

Column 20,
Line 12, "ethcing" should read --etching--;
Line 61, "ethcing" should read --etching--.

Column 21,
Line 42, "ethcing" should read --etching--.

Column 22,
Line 23, "ethcing" should read --etching--.

Column 23,
Line 1, "ethcing" should read --etching--.

Column 24,
Line 2, "56, p⁻-type" should read --56, a p⁻-type--.

Column 25,
Line 16, "n-type" should read --n⁻-type--.

Signed and Sealed this

Third Day of July, 2001

*Nicholas P. Godici*

Attest:

Attesting Officer

NICHOLAS P. GODICI
*Acting Director of the United States Patent and Trademark Office*